(12) United States Patent
Tagami et al.

(10) Patent No.: US 12,382,632 B2
(45) Date of Patent: Aug. 5, 2025

(54) MEMORY DEVICE

(71) Applicant: Kioxia Corporation, Tokyo (JP)

(72) Inventors: Masayoshi Tagami, Kuwana Mie (JP); Keisuke Nakatsuka, Kobe Hyogo (JP)

(73) Assignee: KIOXIA CORPORATION, Tokyo (JP)

( * ) Notice: Subject to any disclaimer, the term of this patent is extended or adjusted under 35 U.S.C. 154(b) by 453 days.

(21) Appl. No.: 18/054,269

(22) Filed: Nov. 10, 2022

(65) Prior Publication Data

US 2023/0397417 A1  Dec. 7, 2023

(30) Foreign Application Priority Data

Jun. 2, 2022  (JP) .................. 2022-090261

(51) Int. Cl.
*H10B 43/20*   (2023.01)
*G11C 5/06*    (2006.01)
*H10B 43/35*   (2023.01)

(52) U.S. Cl.
CPC ............. *H10B 43/20* (2023.02); *G11C 5/063* (2013.01); *H10B 43/35* (2023.02)

(58) Field of Classification Search
CPC ......... H10B 43/20; H10B 43/35; G11C 5/063
See application file for complete search history.

(56) References Cited

U.S. PATENT DOCUMENTS

| 5,033,022 A * | 7/1991 | Segawa ................ G11C 7/18 |
| | | 365/206 |
| 10,297,578 B2 | 5/2019 | Tagami et al. |
| 12,148,476 B2 * | 11/2024 | Ako ................... H10B 41/10 |
| 2023/0307016 A1 * | 9/2023 | Maejima ............ G11C 7/1063 |

FOREIGN PATENT DOCUMENTS

JP   2018-148071 A   9/2018

* cited by examiner

*Primary Examiner* — Richard A Booth
(74) *Attorney, Agent, or Firm* — Maier & Maier, PLLC

(57) ABSTRACT

A memory device includes a substrate; first conductors aligned apart from each other in a first direction; a second conductor and a third conductor each extending in a second direction between the substrate and the first conductors, and being aligned apart from each other in the second direction; fourth conductors aligned apart from each other in the first direction on an opposite side of the substrate with respect to the first conductors; a fifth conductor extending in the second direction between the first conductors and the fourth conductors; and a first interconnect coupling between the fifth conductor and the substrate. The first interconnect includes a contact extending in the first direction and passing through the first conductors between the second and third conductors.

20 Claims, 13 Drawing Sheets

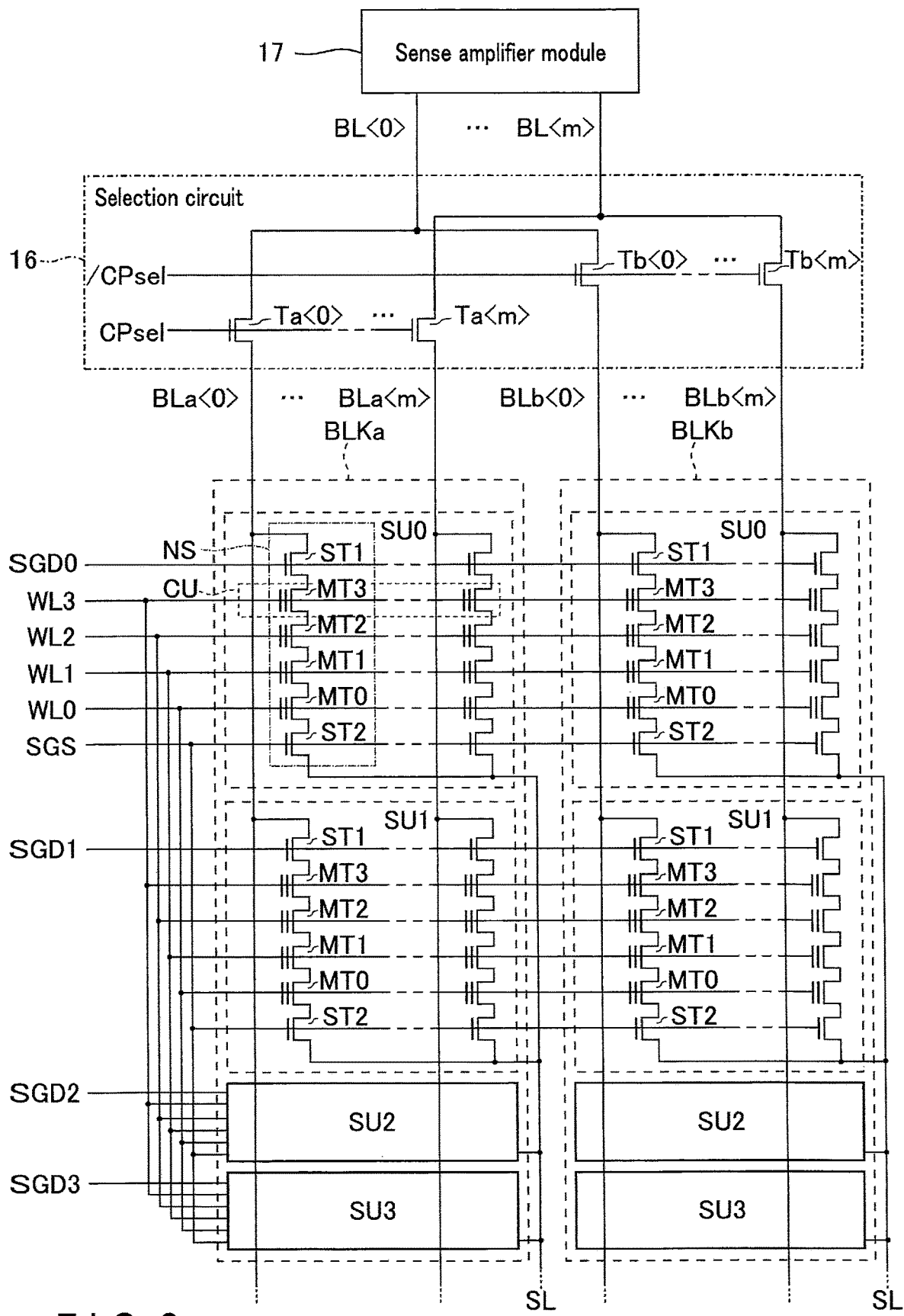
F I G. 2

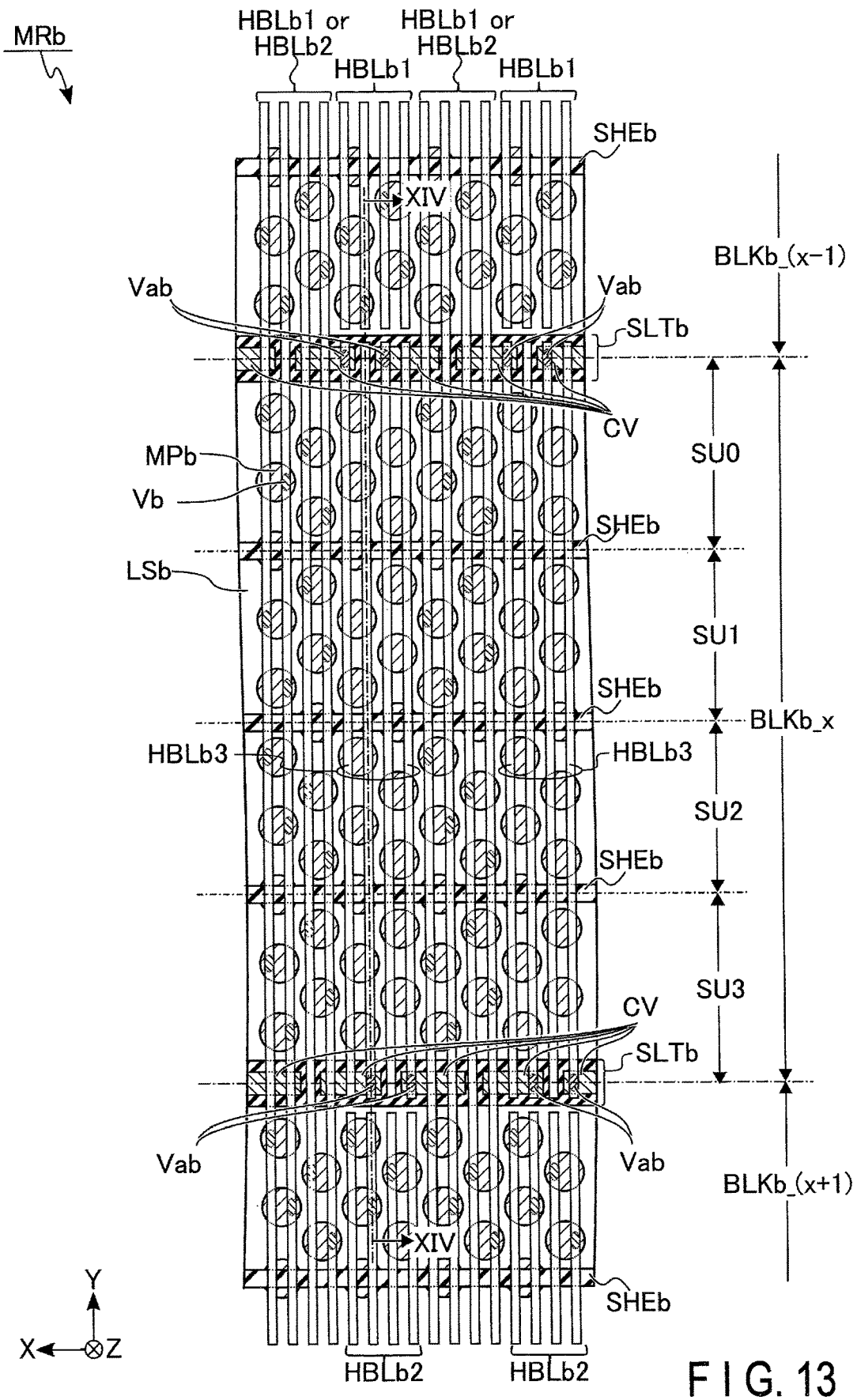
F I G. 13

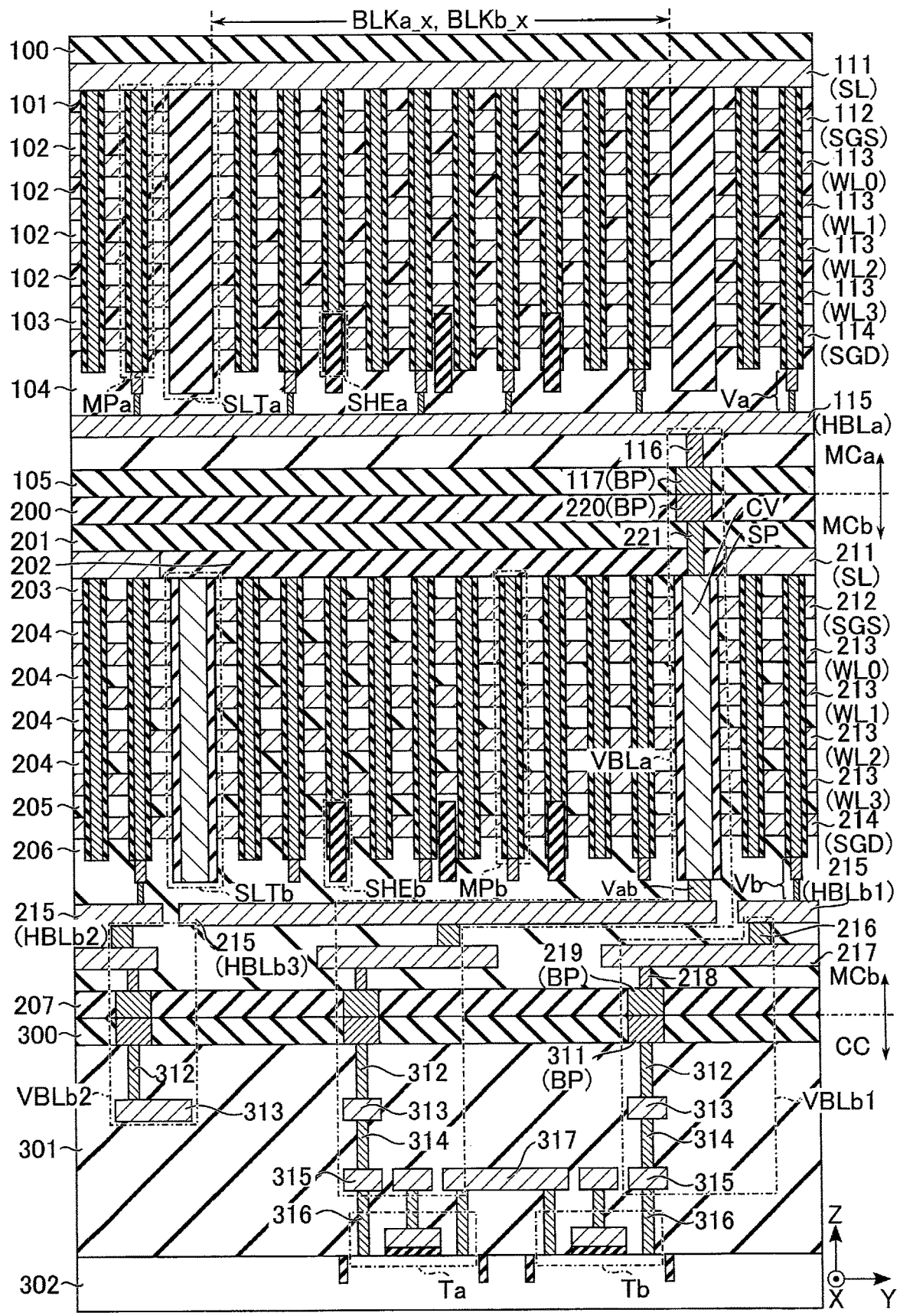
F I G. 14

MEMORY DEVICE

CROSS-REFERENCE TO RELATED APPLICATIONS

This application is based upon and claims the benefit of priority from Japanese Patent Application No. 2022-090261, filed Jun. 2, 2022, the entire contents of which are incorporated herein by reference.

FIELD

Embodiments described herein relate generally to a memory device.

BACKGROUND

As a memory device capable of nonvolatilely storing data, a NAND flash memory is known. A memory device such as a NAND flash memory employs a three-dimensional memory structure to increase the capacity and the degree of integration. A three-dimensional memory structure and a peripheral circuit for controlling the memory structure may be provided in separate chips. In such a case, the memory device is formed by bonding a memory chip provided with the three-dimensional memory structure to a CMOS chip provided with the peripheral circuit.

BRIEF DESCRIPTION OF THE DRAWINGS

FIG. 2 is a circuit diagram showing an exemplary circuit configuration of a memory cell array and a selection circuit of the memory device according to the first embodiment.

FIG. 13 is a plan view corresponding to a region XIII of FIG. 12 and showing an exemplary planar layout in a second memory chip of the memory cell device according to the second embodiment.

FIG. 14 is a sectional view taken along a line XIV-XIV of FIG. 13 and showing an exemplary sectional structure of the memory device according to the second embodiment.

DETAILED DESCRIPTION

Figure 1:
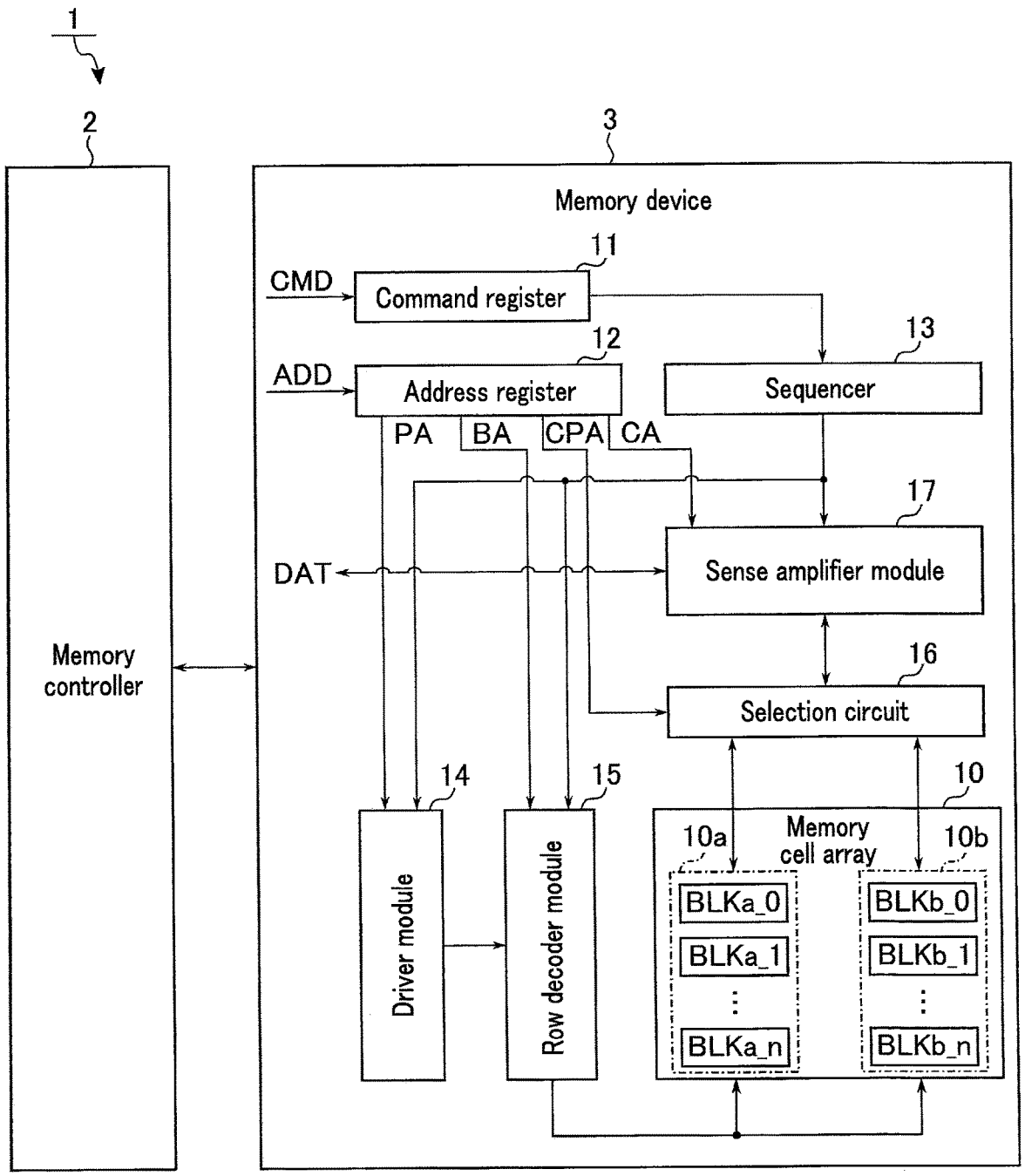
FIG. 1 is a block diagram showing a configuration of a memory system including a memory device according to a first embodiment.

In general, according to one embodiment, a memory device includes a substrate; a plurality of first conductor layers aligned apart from each other in a first direction; a second conductor layer and a third conductor layer each extending in a second direction intersecting the first direction between the substrate and the plurality of first conductor layers, the second conductor layer and the third conductor layer being aligned apart from each other in the second direction; a plurality of fourth conductor layers aligned apart from each other in the first direction on an opposite side of the substrate with respect to the plurality of first conductor layers; a fifth conductor layer extending in the second direction between the plurality of first conductor layers and the plurality of fourth conductor layers; a first memory pillar extending in the first direction, intersecting the plurality of first conductor layers, and coupled to the second conductor layer or the third conductor layer; a second memory pillar extending in the first direction, intersecting the plurality of fourth conductor layers, and coupled to the fifth conductor layer; and a first interconnect coupling between the fifth conductor layer and the substrate. The first interconnect includes a contact extending in the first direction and passing through the plurality of first conductor layers between the second conductor layer and the third conductor layer.

The embodiments will now be described with reference to the drawings.

In the description that follows, components having approximately the same function and configuration will be assigned a common reference numeral. To particularly distinguish a plurality of components with a similar configuration, such components may be referred to by an identical reference numeral with different characters or numbers added at the end.

1. First Embodiment

A first embodiment will be described.
1.1 Configuration
A configuration according to the first embodiment will be described.
1.1.1 Memory System
FIG. 1 is a block diagram for explaining a configuration of a memory system according to the first embodiment. The memory system here is a storage device adapted for connection with an external host (not shown). The memory system is, for example, a memory card such as an SD™ card, a universal flash storage (UFS) device, and a solid state drive (SSD). A memory system 1 includes a memory controller 2 and a memory device 3.

The memory controller 2 is configured as an integrated circuit such as a system-on-a-chip (SoC). The memory controller 2 controls the memory device 3 based on a request from the host. More specifically, for example, the memory controller 2 writes data, which the host has requested the memory controller 2 to write, to the memory device 3. Also, the memory controller 2 reads data, which the host has requested the memory controller 2 to read, from the memory device 3 and transmits the data to the host.

The memory device 3 nonvolatilely stores data. The memory device 3 is, for example, a NAND flash memory.

Communication between the memory controller 2 and the memory device 3 is based on, for example, an SDR (single data rate) interface, a toggle DDR (double data rate) interface, or an ONFI (Open NAND flash interface).

1.1.2 Memory Device

A general configuration of the memory device according to the first embodiment will be described with continuous reference to FIG. 1. The memory device 3 includes, for example, a memory cell array 10, a command register 11, an address register 12, a sequencer 13, a driver module 14, a row decoder module 15, a selection circuit 16, and a sense amplifier module 17.

The memory cell array 10 is a data storage region. The memory cell array 10 includes block groups 10a and 10b. The block groups 10a and 10b correspond to storage regions formed in different chips, respectively. The block group 10a includes a plurality of blocks BLKa_0 to BLKa_n (where n is an integer equal to or greater than 1). The block group 10b includes a plurality of blocks BLKb 0 to BLKb_n. The blocks BLKa and BLKb are each a set of a plurality of memory cells. The blocks BLKa and BLKb are each used as, for example, a data erase unit. Each of the memory cells stores data in a nonvolatile manner. In the memory cell array 10, a plurality of bit lines and a plurality of word lines are provided. Each memory cell is associated with, for example, a single bit line and a single word line. A detailed configuration of the memory cell array 10 will be described later.

The command register 11 stores a command CMD that the memory device 3 receives from the memory controller 2. The command CMD includes an instruction for, for example, the sequencer 13 to perform a read operation, a write operation, an erase operation, etc.

The address register 12 stores address information ADD that the memory device 3 receives from the memory controller 2. The address information ADD includes, for example, a block address BA, a page address PA, a chip address CPA, and a column address CA. For example, the block address BA, the page address PA, the chip address CPA, and the column address CA are used for selecting a block BLK, a word line, a block group, and a bit line, respectively.

The sequencer 13 controls the operation of the entire memory device 3. For example, the sequencer 13 controls the driver module 14, the row decoder module 15, the selection circuit 16, the sense amplifier module 17, etc. to perform read, write, and erase operations, etc., according to the command CMD stored in the command register 11.

The driver module 14 generates voltage for use in each of the read, write, and erase operations, etc. Then, the driver module 14 applies a generated voltage to a signal line corresponding to a selected word line based on, for example, the page address PA stored in the address register 12.

Based on the block address BA stored in the address register 12, the row decoder module 15 selects one corresponding block BLK in the memory cell array 10. Then, for example, the row decoder module 15 transfers the voltage applied to the signal line corresponding to the selected word line to this selected word line in the selected block BLK.

Based on the chip address CPA stored in the address register 12, the selection circuit 16 selects the block group 10a or 10b in the memory cell array 10.

Based on the column address CA stored in the address register 12, the sense amplifier module 17 selects a bit line corresponding to the block group 10a or 10b in the memory cell array 10, selected by the selection circuit 16. The sense amplifier module 17 in the write operation applies a given voltage to each bit line according to write data DAT received from the memory controller 2. Also, the sense amplifier module 17 in the read operation determines data stored in a memory cell based on the voltage of the corresponding bit line and transfers the determination result to the memory controller 2 as read data DAT.

1.1.3 Circuit Configuration of Memory Cell Array and Selection Circuit

FIG. 2 is a circuit diagram showing an exemplary circuit configuration of the memory cell array and the selection circuit provided in the memory device according to the first embodiment. FIG. 2 shows a coupling relation between a pair of one block BLKa and one block BLKb in the memory cell array 10 and a pair of the selection circuit 16 and the sense amplifier module 17. As shown in FIG. 2, each of the blocks BLKa and BLKb includes, for example, four string units SU0 to SU3.

Each string unit SU in the block BLKa includes a plurality of NAND strings NS respectively associated with bit lines BLa<0>, . . . , and BLa<m> (where m is an integer equal to or greater than 1). Each string unit SU in the block BLKb includes a plurality of NAND strings NS respectively associated with bit lines BLb<0>, . . . , and BLb<m>. The NAND strings NS each include, for example, memory cell transistors MT0 to MT3 and select transistors ST1 and ST2. Each memory cell transistor MT includes a control gate and a charge accumulation portion, and nonvolatilely stores data. The select transistors ST1 and ST2 are each used for the selection of the applicable string unit SU in various operations.

In each NAND string NS, the memory cell transistors MT0 to MT3 are coupled in series. A first end of the select transistor ST1 in the block BLKa is coupled to an associated bit line BLa. A first end of the select transistor ST1 in the block BLKb is coupled to an associated bit line BLb. A second end of the select transistor ST1 is coupled to a first end of the serially coupled memory cell transistors MT0 to MT3. A first end of the select transistor ST2 is coupled to a second end of the serially coupled memory cell transistors MT0 to MT3. A second end of the select transistor ST2 is coupled to a source line SL.

In a pair of the blocks BLKa and BLKb, control gates of the memory cell transistors MT0 to MT3 are respectively coupled to the word lines WL0 to WL3. Gates of the select transistors ST1 in the string units SU0 to SU3 are respectively coupled to the select gate lines SGDO to SGD3. The plurality of select transistors ST2 have their gates coupled to a select gate line SGS.

For example, the bit lines BLa and BLb that form a pair are assigned the same column address CA. The following description assumes that the bit lines BLa and BLb in a pair assigned the same column address CA are assigned the same reference symbol <k> (00≤k≤m). The column address CA assigned to each of the bit lines BLa<0> and BLb<0>, . . . , and the column address CA assigned to each of the bit lines BLa<m> and BLb<m> differ from each other. Meanwhile, the bit lines BLa and BLb assigned the same column address CA are assigned different chip addresses CPA, which enables discrimination between these bit lines BLa and BLb.

Each bit line BLa is shared by a plurality of NAND strings NS assigned the same column address CA in the block group 10a. Each bit line BLb is shared by a plurality of memory NAND strings NS assigned the same column address CA in the block group 10b. The word lines WL0 to WL7 as a group are provided for each of the blocks BLKa and BLKb. The source line SL is shared by, for example, the block groups 10a and 10b.

A set of memory transistors MT coupled to a common word line WL in each string unit SU is referred to as, for example, a "cell unit CU". For example, the storage capacity of the cell unit CU including the memory cell transistors MT each adapted to store 1-bit data is defined as "1-page data". Each cell unit CU may have a storage capacity of 2-pages of data or more according to the number of bit data stored in the memory cell transistor MT.

Note that the circuit configuration of the memory cell array 10 provided in the memory device 3 according to the first embodiment is not limited to the configuration described above. For example, the number of string units SU included in each block BLK can be freely designed. The number of memory cell transistors MT and the number of select transistors ST1 and ST2 included in each NAND string NS can be freely designed.

The circuit configuration of the selection circuit of the memory device according to the first embodiment will be described with continuous reference to the circuit diagram shown in FIG. 2. The selection circuit 16 includes a plurality of transistors Ta<0>, . . . , and Ta<m>, and Tb<0>, . . . , and Tb<m>.

The transistor Ta<k> includes a first end coupled to the bit line BLa<k>, a second end coupled to the sense amplifier module 17 via a bit line BL<k>, and a control end to which a signal CPsel is supplied (0≤k≤m). The transistor Tb<k> includes a first end coupled to the bit line BLb<k>, a second end coupled to the sense amplifier module 17 via a bit line BL<k>, and a control end to which a signal /CPsel is supplied. The signals CPsel and /CPsel differ in polarity from each other. That is, in the case of the signal CPsel being at an "H" level, the signal /CPsel is at an "L" level. In this case, the transistors Ta<0> to Ta<m> are in an ON state and the transistors Tb<0> to Tb<m> are in an OFF state. Furthermore, in the case of the signal CPsel being at the "L" level, the signal /CPsel is at the "H" level. In this case, the transistors Ta<0> to Ta<m> are in the OFF state and the transistors Tb<0> to Tb<m> are in the ON state. In this manner, the bit line BL<k> is selectively coupled to one of the bit lines BLa<k> and BLb<k>.

1.1.4 Bonded Structure of Memory Device

Figure 3:
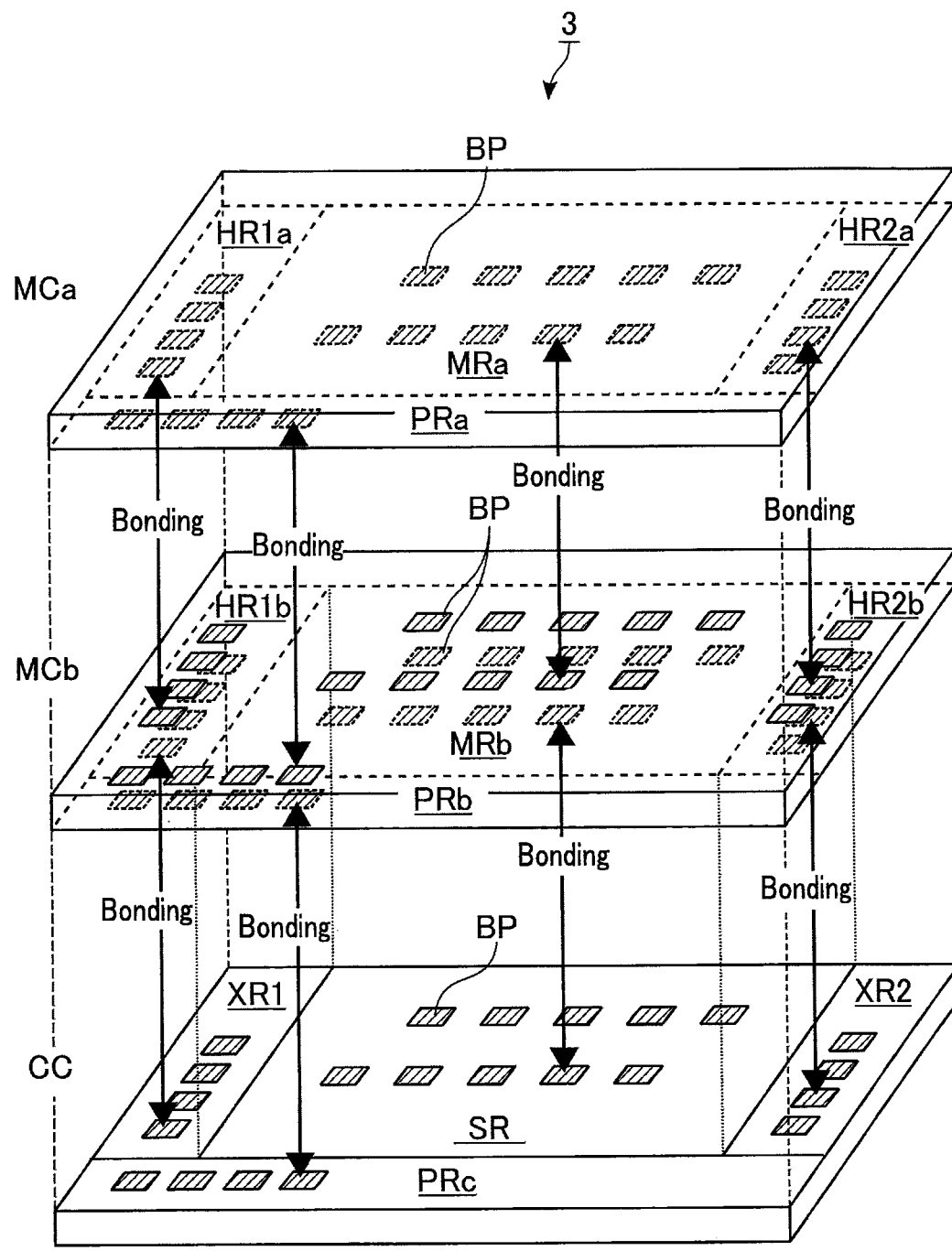
FIG. 3 is a view showing an exemplary bonded structure of the memory device according to the first embodiment.

FIG. 3 is a view showing an exemplary bonded structure of the memory device according to the first embodiment. As shown in FIG. 3, the memory device 3 includes a first memory chip MCa, a second memory chip MCb, and a CMOS chip CC. The memory device 3 is formed by bonding the first memory chip MCa and the CMOS chip CC to the second memory chip MCb in such a manner that the second memory chip MCb is sandwiched therebetween. The first memory chip MCa and the second memory chip MCb are bonded together and the second memory chip MCb and the CMOS chip CC are bonded together by means of a plurality of bonding pads BP.

The first memory chip MCa includes a structure corresponding to the block group 10a of the memory cell array 10. The second memory chip MCb includes a structure corresponding to the block group 10b of the memory cell array 10. The CMOS chip CC includes a structure corresponding to, for example, the command register 11, the address register 12, the sequencer 13, the driver module 14, the row decoder module 15, the selection circuit 16, and the sense amplifier module 17.

In the following, a plane in which the CMOS chip CC and the second memory chip MCb are bonded together will be referred to as an XY plane. A plane in which the first memory chip MCa and the second memory chip MCb are bonded together is substantially parallel to the XY plane. Within the XY plane, the directions intersecting each other will be referred to as an "X direction" and a "Y direction". Furthermore, a direction extending from the CMOS chip CC to the second memory chip MCb will be referred to as a +Z direction. On the other hand, a direction extending from the second memory chip MCb to the CMOS chip CC will be referred to as a −Z direction. As described above, "+" or "−" may be assigned to a direction in order to distinguish whether a direction is a + direction or a −direction. The Z direction not assigned "+" or "−" indicates the +Z direction. The +Z direction may be referred to as an upward direction. The −Z direction may be referred to as a downward direction.

The region of the first memory chip MCa may be divided into, for example, a memory region MRa, hookup regions HR1a and HR2a, and a pad region PRa. The memory region MRa corresponds to a region in which the block group 10a is formed within the memory cell array 10. The hookup regions HR1a and HR2a sandwich, for example, the memory region MRa in the X direction. The pad region PRa is arranged in the Y direction alongside the memory region MRa and the hookup regions HR1a and HR2a.

The region of the second memory chip MCb may be divided into, for example, a memory region MRb, hookup regions HR1b and HR2b, and a pad region PRb. The memory region MRb corresponds to a region in which the block group 10b is formed within the memory cell array 10. The memory region MRb is arranged in such a manner as to overlap with the memory region MRa when viewed in the Z direction. The hookup regions HR1b and HR2b sandwich, for example, the memory region MRb in the X direction. The hookup regions HR1b and HR2b are arranged in such a manner as to overlap with the hookup regions HR1a and HR2a, respectively, when viewed in the Z direction. The pad region PRb is arranged in the Y direction alongside the memory region MRb and the hookup regions HR1b and HR2b. The pad region PRb is arranged in such a manner as to overlap with the pad region PRa when viewed in the Z direction.

The region of the CMOS chip CC may be divided into, for example, a sense amplifier region SR, transfer regions XR1 and XR2, and a pad region PRc. In the sense amplifier region SR, the command register 11, the address register 12, the sequencer 13, the selection circuit 16, the sense amplifier module 17, etc., are arranged. The sense amplifier region SR is arranged in such a manner as to overlap with the memory regions MRa and MRb when viewed in the Z direction. In the transfer regions XR1 and XR2, the driver module 14, the row decoder module 15, etc., are arranged. The transfer regions XR1 and XR2 sandwich the sense amplifier region SR in the X direction. The hookup regions XR1 and XR2 are arranged in such a manner that the hookup region XR1 overlaps with the hookup regions HR1a and HR1b, and the hookup region XR2 overlaps with the hookup regions HR2a and HR2b when viewed in the Z direction. In the pad region PRc, an input/output circuit of the memory device 3, etc., is arranged. The pad region PRc is arranged in such a manner as to overlap with the pad regions PRa and PRb when viewed in the Z direction.

A pair of bonding pads BP facing each other between the first memory chip MCa and the second memory chip MCb and a pair of bonding pads BP facing each other between the second memory chip MCb and the CMOS chip CC are bonded together ("Bonding" in FIG. 3). As a result, the circuits in the first memory chip MCa, the circuits in the second memory chip MCb, and the circuits in the CMOS chip CC are electrically coupled together.

In the following description, the memory regions MRa and MRb may be referred to as a memory region MR when they are not particularly distinguished from each other. The hookup regions HR1a and HR1b may be referred to as a hookup region HR1 when they are not particularly distinguished from each other. The hookup regions HR2a and HR2b may be referred to as a hookup region HR2 when they are not particularly distinguished from each other.

Note that the memory device 3 according to the first embodiment is not limited to the above described configuration. For example, the number of hookup regions HR formed in each of the first memory chip MCa and the second memory chip MCb is not limited to two as long as the same number of regions HR are formed in each of these chips. Each of the first memory chip MCa and the second memory chip MCb may include a plurality of pairs of the memory region MR and the hookup region HR. In this case, a pair of the sense amplifier region SR and the transfer region XR is appropriately formed in such a manner as to correspond to the arrangement of the memory region MR and the hookup region HR.

1.1.5 Layout of Bit Line

Figure 4:
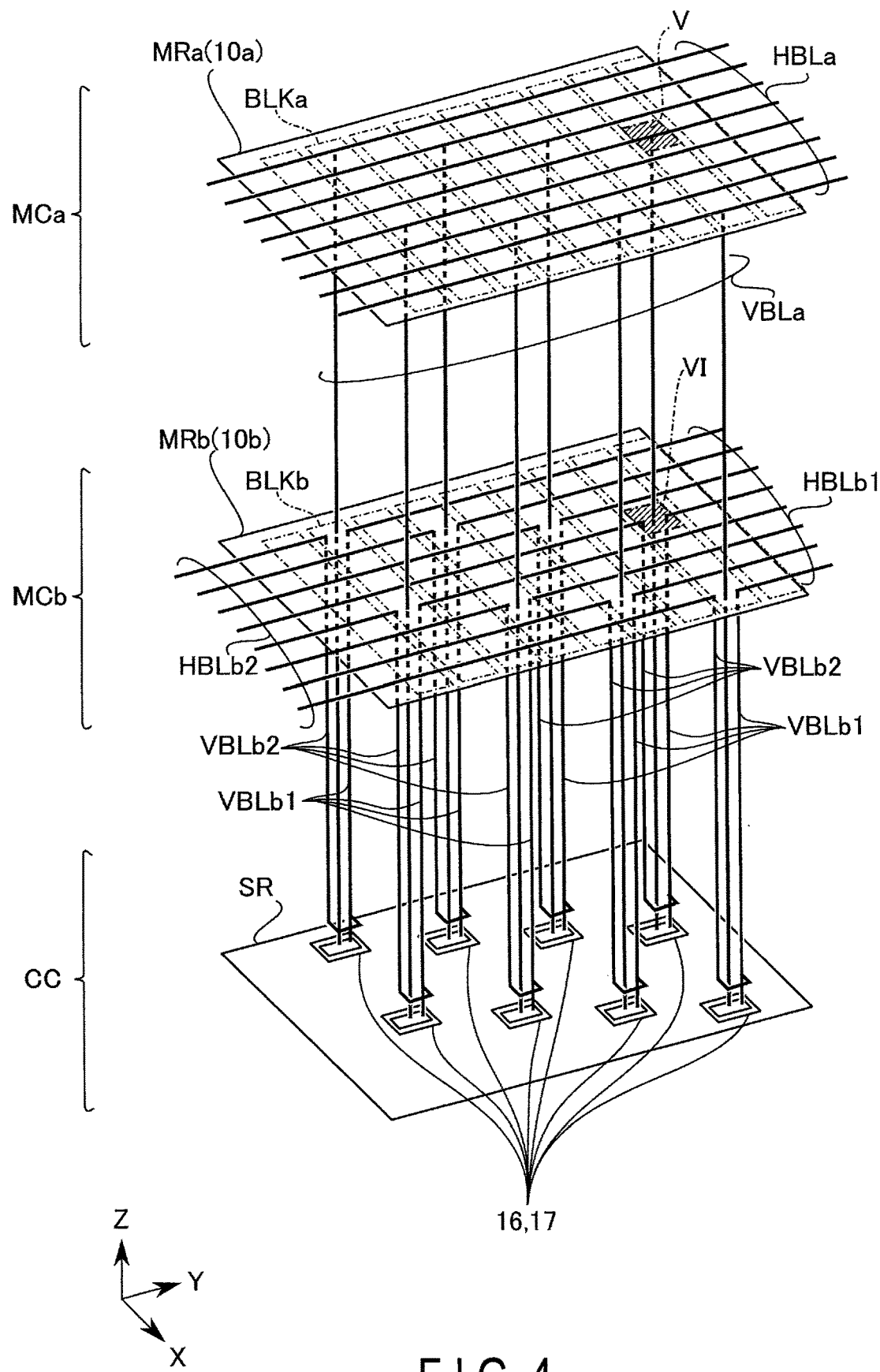
FIG. 4 is a view showing an exemplary three-dimensional layout of bit lines of the memory device according to the first embodiment.

FIG. 4 is a view showing an exemplary three-dimensional layout of bit lines of a memory device according to the first embodiment. FIG. 4 shows an exemplary three-dimensional layout of the block groups 10a and 10b of the memory cell array 10, the selection circuit 16 and the sense amplifier module 17, and the bit lines BLa and BLb that couple them together.

In the memory region MRa of the first memory chip MCa, the block group 10a is arranged. The plurality of blocks BLKa in the block group 10a are aligned in the Y direction. Each of the blocks BLKa extends in the X direction.

In the memory region MRb of the second memory chip MCb, the block group 10b is arranged. The plurality of blocks BLKb in the block group 10b are aligned in the Y direction. Each of the blocks BLKb extends in the X direction.

In the sense amplifier region SR of the CMOS chip CC, the selection circuit 16 and the sense amplifier module 17 are dispersed and arranged in the plurality of regions. The plurality of regions in which the selection circuit 16 and the sense amplifier module 17 are dispersed and arranged are arranged in such a manner as to be separated from each other by a predetermined distance or greater. FIG. 4 shows an exemplary case in which the selection circuit 16 and the sense amplifier module 17 are dispersed and arranged in eight regions in the sense amplifier region SR.

Each of the bit lines BLa includes an in-plane interconnect HBLa and an out-plane interconnect VBLa. The in-plane interconnect HBLa is included in each bit line BLa and is arranged in the XY plane within the first memory chip MCa. The out-plane interconnect VBLa is included in each bit line BLa and extends from the first memory chip MCa to the CMOS chip CC. A single pair of the in-plane interconnect HBLa and the out-plane interconnect VBLa shown in FIG. 4 may represent a plurality of pairs of them.

The plurality of in-plane interconnects HBLa are aligned in the X direction within the memory region MRa of the first memory chip MCa. Each of the in-plane interconnects HBLa has a portion that extends in the Y direction in such a manner as to cross all of the blocks BLKa of the block group 10a. Each of the in-plane interconnects HBLa is coupled to the corresponding out-plane interconnect VBLa at a position at which the in-plane interconnect HBLa overlaps with the corresponding block BLKa when viewed in the Z direction. Positions at which the out-plane interconnects VBLa and the in-plane interconnects HBLa are coupled together are dispersed and arranged in a plurality of regions of the memory region MRa. FIG. 4 shows an exemplary case in which the positions at which the out-plane interconnects VBLa and the in-plane interconnects HBLa are coupled together are dispersed and arranged in eight regions of the memory region MRa.

Each of the out-plane interconnects VBLa has a first end coupled to the corresponding in-plane interconnect HBLa, a second end coupled to the selection circuit 16, and a middle portion that extends through the memory region MRb of the second memory chip MCb. The middle portion of the out-plane interconnect VBLa passes through the block BLKb at a position that overlaps with the block BLKb at the position that overlaps with the block BLKa corresponding to a position at which the out-plane interconnect VBLa and the in-plane interconnect HBLa are coupled together when viewed in the Z direction.

Each of the bit lines BLb includes in-plane interconnects HBLb1 and HBLb2 and out-plane interconnects VBLb1 and VBLb2. The in-plane interconnects HBLb1 and HBLb2 are included in the bit lines BLb and are arranged in the XY plane within the second memory chip MCb. The out-plane interconnects VBLb1 and VBLb2 are included in the bit lines BLb and extend from the second memory chip MCb to the CMOS chip CC. A single set of the in-plane interconnects HBLb1 and HBLb2 and the out-plane interconnects VBLb1 and VBLb2 shown in FIG. 4 may represent a plurality of sets of the in-plane interconnects HBLb1 and HBLb2 and the out-plane interconnects VBLb1 and VBLb2.

The plurality of in-plane interconnects HBLb1 are aligned in the X direction within the memory region MRb of the second memory chip MCb. Each of the in-plane interconnects HBLb1 has a portion that extends in the Y direction in such a manner as to cross at least one of the blocks BLKb within the block group 10b.

The plurality of in-plane interconnects HBLb2 are aligned in the X direction within the memory region MRb of the second memory chip MCb. Each of the in-plane interconnects HBLb2 has a portion that extends in the Y direction in such a manner as to cross at least one of the blocks BLKb within the block group 10b. Each of the in-plane interconnects HBLb2 is aligned in the Y direction with the corresponding in-plane interconnect HBLb1. A middle portion of the out-plane interconnect VBLa passes through a gap between the corresponding in-plane interconnects HBLb1 and HBLb2 aligned in the Y direction.

Each of the out-plane interconnects VBLb1 has a first end coupled to the corresponding in-plane interconnect HBLb1, a second end coupled to the selection circuit 16, and a middle portion passing through the inside of the CMOS chip CC. The transistor Tb to which the second end of the out-plane interconnect VBLb1 is coupled is arranged in a vicinity of the transistor Ta to which the second end of the corresponding out-plane interconnect VBLa is coupled.

Each of the out-plane interconnects VBLb2 has a first end coupled to the corresponding in-plane interconnect HBLb2, a second end coupled to a middle portion of the corresponding out-plane interconnect VBLb1, and a middle portion passing through the inside of the CMOS chip CC. The second end of the out-plane interconnect VBLb2 is arranged inside the CMOS chip CC.

1.1.6 Planar Layout of Memory Cell Array

Next, the planar layout of the memory cell array of the memory device according to the first embodiment will be described.

Figure 5:
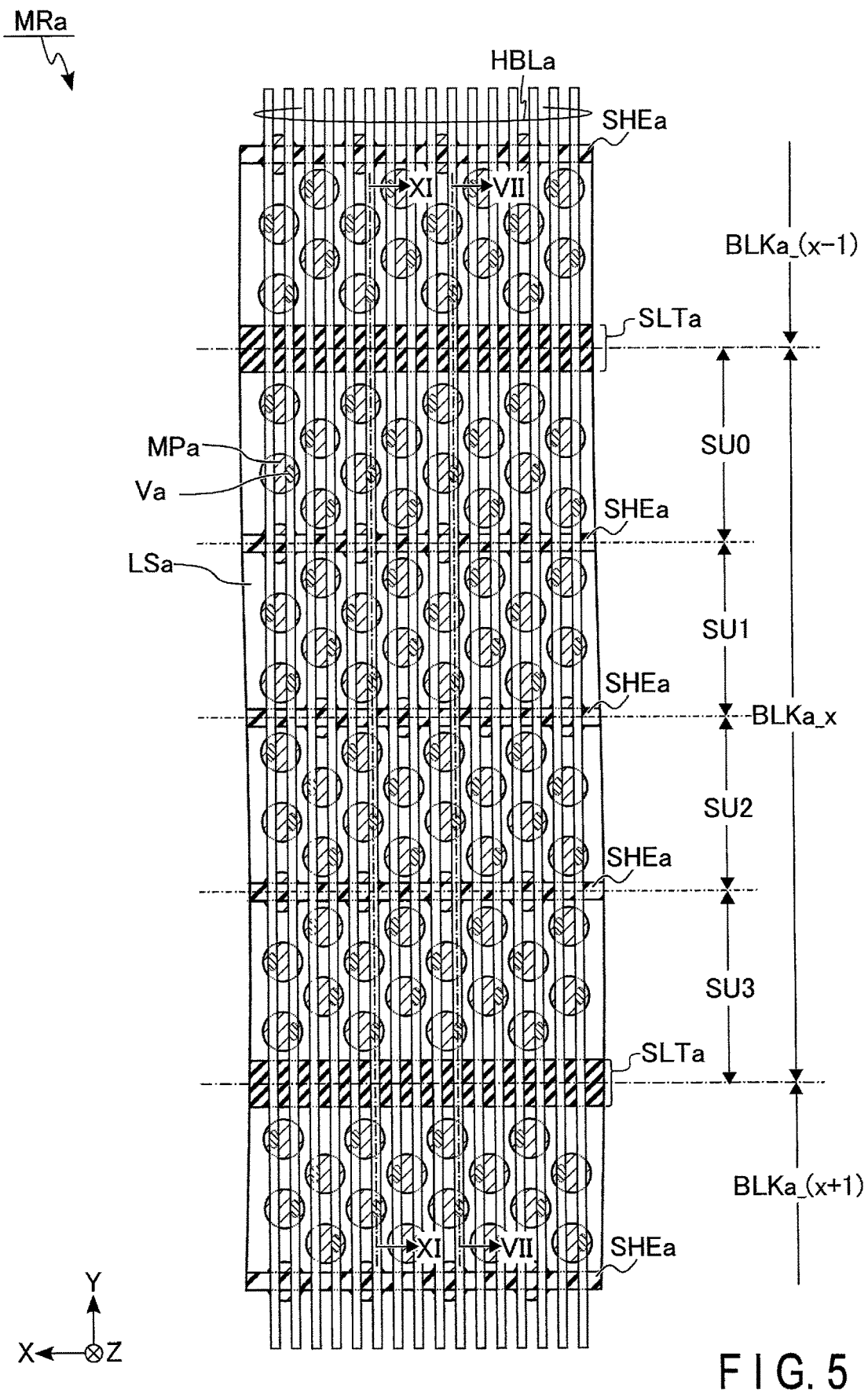
FIG. 5 is a plan view corresponding to a region V of FIG. 4 and showing an exemplary planar layout in a first memory chip of the memory cell array of the memory device according to the first embodiment.

FIG. 5 is a plan view corresponding to a region V of FIG. 4 and showing an exemplary planar layout in the first memory chip of the memory cell array of the memory device according to the first embodiment. FIG. 5 shows a region included in the memory region MRa and including a portion corresponding to the block BLKa x in the memory region MRa and a vicinity of the aforementioned portion ($1 \leq x \leq n-1$). In the memory region MRa, the memory cell array includes a stacked interconnect structure LSa and a plurality of members SLTa and SHEa.

The stacked interconnect structure LSa has a structure in which a plurality of conductor layers are stacked in the Z direction with an insulation layer intervening therebetween throughout the memory region MRa and the hookup regions HR1a and HR2a. Each of the conductor layers that constitute the stacked interconnect structure LSa corresponds to one of the source line SL, the word lines WL, and the select gate lines SGD and SGS. The stacked interconnect structure LSa will be described later in detail.

The plurality of members SLTa are, for example, plate shaped insulators extending along the XZ plane. The plurality of members SLTa are aligned in the Y direction. Each of the members SLTa extends in the X direction in such a manner as to traverse the memory region MRa and the hookup regions HR1a and HR2a in a boundary region between the adjacent blocks BLKa. Each of the members SLTa divides into two portions aligned in the Y direction the conductor layers that are included in the stacked interconnect structure LSa and correspond to the word lines WL and the select gate lines SGD and SGS.

The plurality of members SHEa are, for example, plate shaped insulators extending along the XZ plane. The plurality of members SHEa are aligned in the Y direction. In the example shown in FIG. 5, three of the members SHEa are arranged between the adjacent members SLTa. Each of the members SHEa extends in the X direction in such a manner as to traverse the memory region MRa. Each of the members SHEa has both ends positioned at the hookup regions HR1a and HR2a, respectively. Each of the members SHEa divides into two portions aligned in the Y direction the conductor layer that is included in the stacked interconnect structure LSa and corresponds to the select gate line SGD.

Each of the regions delimited by the members SLTa corresponds to one block BLKa. Also, each of the regions delimited by the members SLTa and SHEa corresponds to one string unit SU. In the memory regions MRa and the hookup regions HR1a and HR2a, the aforementioned layout is repeatedly arranged in the Y direction throughout the blocks BLKa_0 to BLKa_n.

In the memory region MRa, the memory cell array further includes a plurality of memory pillars MPa, a plurality of contacts Va, and a plurality of in-plane interconnects HBLa.

Each of the memory pillars MPa functions as, for example, one NAND string NS. The memory pillars MPa are arranged in a staggered pattern of 19 lines inside the stacked interconnect structure LSa between two adjacent members SLTa. For example, one member SHEa overlaps with each of the memory pillars MPa in the fifth line counted from the upper side of the drawing, the memory pillars MPa in the 10th line, and the memory pillars MPa in the 15th line.

Each of the in-plane interconnects HBLa is arranged in such a manner as to overlap with at least one memory pillar MPa for each string unit SU. FIG. 5 shows an exemplary case in which two in-plane interconnects HBLa are arranged in such a manner as to overlap with one memory pillar MPa. One of the plurality of in-plane interconnects HBLa that overlap with the memory pillars MPa, and one corresponding memory pillar MPa are electrically coupled together via a contact Va.

The contact Va between the memory pillar MPa in contact with the member SHEa and the in-plane interconnect HBLa is omitted. In other words, the contact Va between the memory pillar MPa in contact with two different select gate lines SGD and the in-plane interconnect HBLa is omitted. The numbers and arrangements of memory pillars MPa, members SHEa, and so on between the adjacent members SLTa are not limited to those of the configuration described with reference to FIG. 5 and may be appropriately altered. The number of in-plane interconnects HBLa that overlap with the respective memory pillars MPa may be freely designed.

Figure 6:
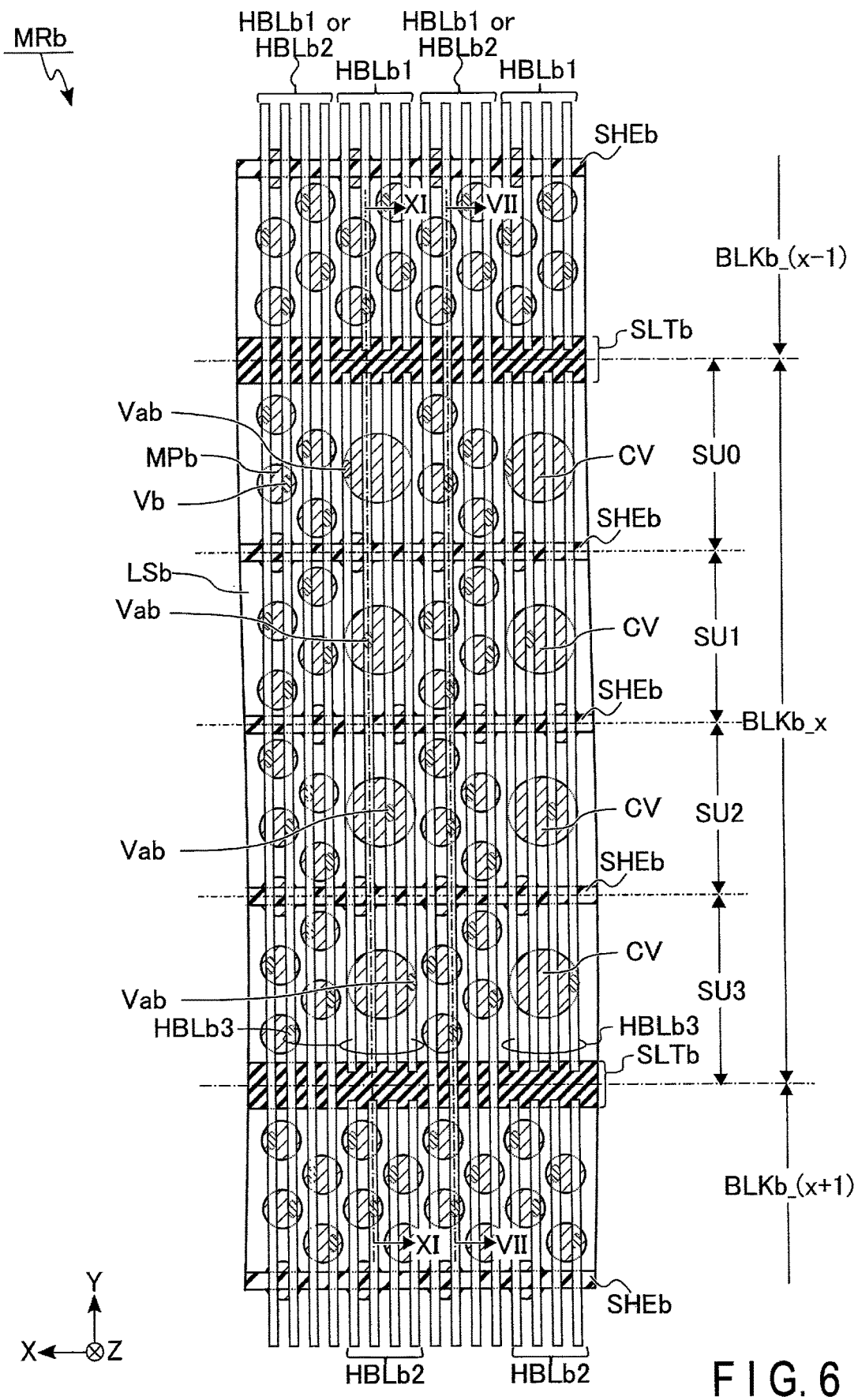
FIG. 6 is a plan view corresponding to a region VI of FIG. 4 and showing an exemplary planar layout in a second memory chip of the memory cell array of the memory device according to the first embodiment.

FIG. 6 is a plan view corresponding to a region VI of FIG. 4 and showing an exemplary planar layout in the second memory chip of the memory cell array of the memory device according to the first embodiment. FIG. 6 shows a region including a portion corresponding to the block BLKb x in the memory region MRb and a vicinity of the aforementioned portion ($1 \leq x \leq n-1$). The block BLKb x corresponds to the block BLKb through which the middle portion of the out-plane interconnect VBLa passes in the Z direction. In the memory region MRb, the memory cell array includes a stacked interconnect structure LSb and a plurality of members SLTb and SHEb.

The stacked interconnect structure LSb has a structure in which a plurality of conductor layers are stacked in the Z direction with an insulation layer intervening therebetween throughout the memory region MRb and the hookup regions HR1b and HR2b. Each of the conductor layers that constitute the stacked interconnect structure LSb corresponds to one of the source line SL, the word lines WL, and the select gate lines SGD and SGS. The stacked interconnect structure LSb will be described later in detail.

The plurality of members SLTb are, for example, plate shaped insulators extending along the XZ plane. The plurality of members SLTb are aligned in the Y direction. Each of the members SLTb extends in the X direction in such a manner as to traverse the memory region MRb and the hookup regions HR1b and HR2b in a boundary region between the adjacent blocks BLKb. Each of the members SLTb divides into two portions aligned in the Y direction the conductor layers that are included in the stacked interconnect structure LSb and correspond to the word lines WL and the select gate lines SGD and SGS.

The plurality of members SHEb are, for example, plate shaped insulators extending along the XZ plane. The plurality of members SHEb are aligned in the Y direction. In the example shown in FIG. 6, three of the members SHEb are arranged between the adjacent members SLTb. Each of the members SHEb extends in the X direction in such a manner as to traverse the memory region MRb. Each of the members SHEb has both ends positioned in the hookup regions HR1b and HR2b, respectively. Each of the members SHEb divides into two portions aligned in the Y direction the conductor layer that is included in the stacked interconnect structure LSb and corresponds to the select gate line SGD.

Each of the regions delimited by the members SLTb corresponds to one block BLKb. Also, each of the regions delimited by the members SLTb and SHEb corresponds to one string unit SU. In the memory region MRb and the hookup regions HR1b and HR2b, the aforementioned layout is repeatedly arranged in the Y direction throughout the blocks BLKb 0 to BLKb_n.

In the memory region MRb, the memory cell array includes the plurality of memory pillars MPb, the plurality of contacts Vb, Vab, and CV, and the plurality of in-plane interconnects HBLb1, HBLb2, and HBLb3.

Each of the in-plane interconnects HBLb3 is arranged between the corresponding in-plane interconnects HBLb1 and HBLb2. Each of the in-plane interconnects HBLb3 extends in the Y direction. A set of the in-plane interconnects HBLb1, HBLb2, and HBLb3 is formed by dividing one interconnect at two portions.

The in-plane interconnects HBLb1 and HBLb3 have the ends facing each other and these ends are arranged in positions that overlap with the members SLTb when viewed in the Z direction, for example. The in-plane interconnects HBLb2 and HBLb3 have the ends facing each other and these ends are arranged in positions that overlap with the member SLTb when viewed in the Z direction, for example. That is, the in-plane interconnect HBLb3 is arranged in such a manner as to overlap with one block BLKb (the block BLKb x in FIG. 6). FIG. 6 shows an exemplary case in which in the region overlapping with the block BLKb x, four in-plane interconnects HBLb1 or HBLb2, and four in-plane interconnects HBLb3 are alternately aligned in the X direction.

The plurality of memory pillars MPb are arranged in a staggered pattern of 19 lines inside the stacked interconnect structure LSb between two adjacent members SLTb. For example, one member SHEb overlaps with each of the memory pillars MPb in the fifth line counted from the upper side of the drawing, the memory pillars MPb in the line, and the memory pillars MPb in the 15th line.

The contact CV corresponds to the middle portion of the out-plane interconnect VBLa. The plurality of contacts CV are arranged in, for example, a matrix pattern of four lines within the stacked interconnect structure LSb between two adjacent members SLTb. FIG. 6 shows an exemplary case in which the contact CV in a row is aligned for each of the regions corresponding to the string units SU within the block BLKb x.

More specifically, in the block BLKb x, four memory pillars MPb from the first to fourth rows aligned in the Y direction and one contact CV in the first row are alternately arranged in the X direction. More specifically, in the block BLKb x, four memory pillars MPb from the sixth to ninth rows aligned in the Y direction and one contact CV in the second row are alternately arranged in the X direction. Four memory pillars MPb from the 11th to 14th rows aligned in the Y direction and one contact CV in the third row are alternately arranged in the X direction. Four memory pillars MPb from the 16th to 19th rows aligned in the Y direction and one contact CV in the fourth row are alternately arranged in the X direction.

Each of the in-plane interconnects HBLb1 and in-plane interconnects HBLb2 is arranged in such a manner as to overlap with at least one memory pillar MPb for each string unit SU. FIG. 6 shows an exemplary case in which two in-plane interconnects HBLb1 or HBLb2 are arranged in such a manner as to overlap with one memory pillar MPb.

One of the plurality of in-plane interconnects HBLb1 or HBLb2 that overlap with the memory pillar MPb, and one corresponding memory pillar MPb, are electrically coupled together via a contact Vb.

Each of the in-plane interconnects HBLb3 is arranged in such a manner as to overlap with at least one contact CV arranged in the corresponding block BLKb. FIG. 6 shows an exemplary case in which four in-plane interconnects HBLb3 are arranged in such a manner as to overlap with one contact CV. One of the plurality of in-plane interconnects HBLb3 that overlap with the contact CV, and one corresponding contact CV, are electrically coupled together via a contact Vab.

The contact Vb between the memory pillar MPb in contact with the member SHEb and the in-plane interconnect HBLb1 or HBLb2 is omitted. In other words, the contact Vb between the memory pillar MPa in contact with two different select gate lines SGD and the in-plane interconnect HBLb1 or HBLb2 is omitted. The numbers and arrangements of memory pillars MPb, members SHEb, and so on between the adjacent members SLTb are not limited to those of the configuration described with reference to FIG. 6 and may be appropriately altered. The numbers of in-plane interconnects HBLb1 and HBLb2 that overlap with the respective memory pillars MPb may be freely designed. The number of in-plane interconnects HBLb3 that overlap with each contact CV may be freely designed.

Figure 7:
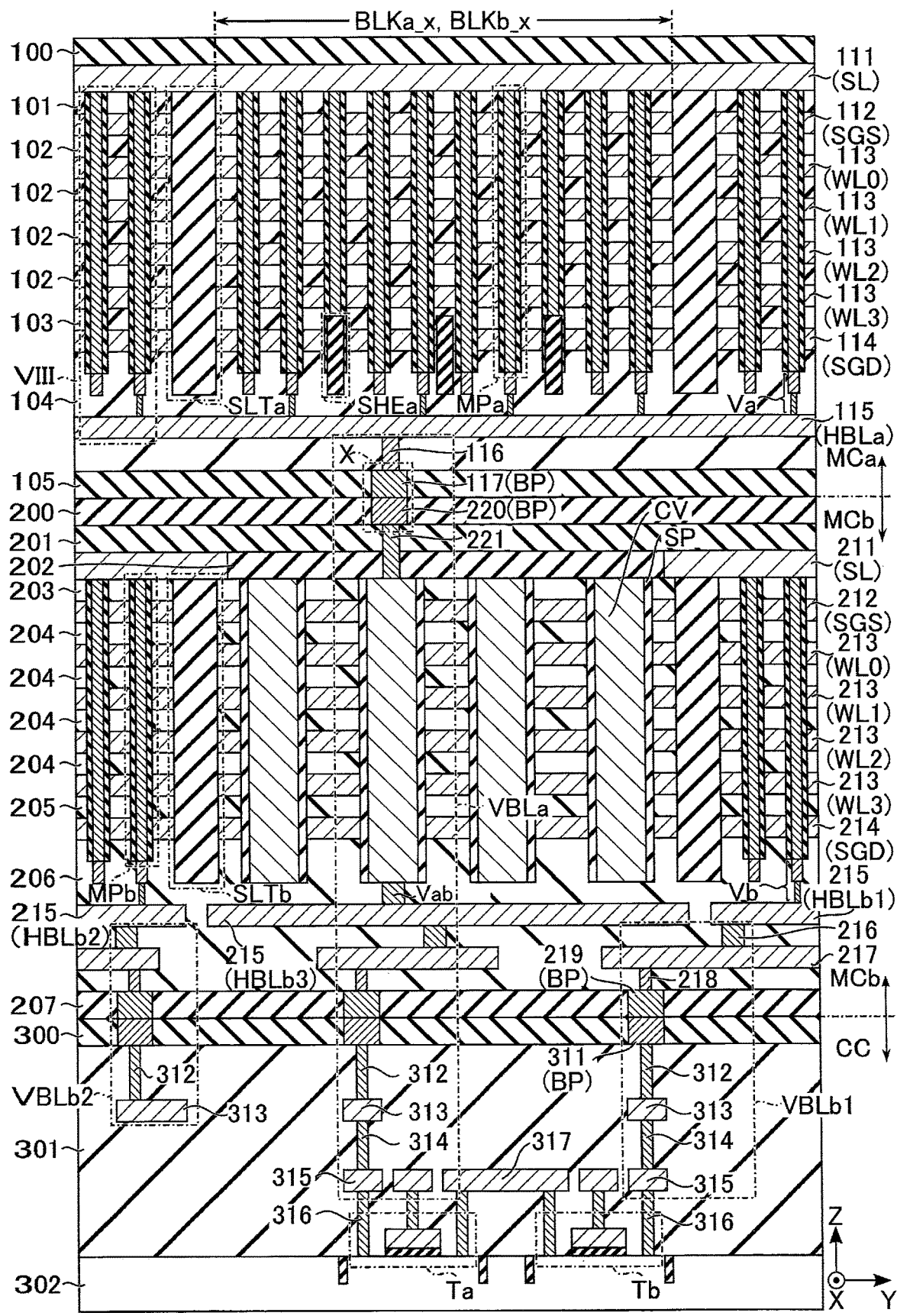
FIG. 7 is a sectional view taken along a line VII-VII of FIG. 5 and FIG. 6 and showing an exemplary sectional structure of the memory device according to the first embodiment.

1.1.7 Sectional Structure of Memory Device in Cross Section Including Out-Plane Interconnect VBLa FIG. 7 is a sectional view taken along a line VII-VII of FIGS. 5 and 6 and showing an exemplary sectional structure of the memory device according to the first embodiment. FIG. 7 shows a configuration in which the CMOS chip CC, the first memory chip MCa, and the second memory chip MCb are bonded together. FIG. 7 shows a sectional structure corresponding to the sense amplifier region SR in addition to a sectional structure corresponding to the memory region MRa shown in FIG. 5 and a sectional structure corresponding to the memory region MRb shown in FIG. 6.

First, a configuration of the first memory chip MCa will be described.

The conductor layer 111 is provided on the lower surface of the insulation layer 100. The conductor layer 111 is formed, for example, in a plate-like shape expanding along the XY plane. The conductor layer 111 is used as the source line SL. The conductor layer 111 includes, for example, polysilicon. The insulation layer 100 includes an insulator such as silicon oxide.

A conductor layer 112 is provided below the conductor layer 111 with an insulation layer 101 intervening therebetween. The conductor layer 112 is formed, for example, in a plate-like shape expanding along the XY plane. The conductor layer 112 serves as the select gate line SGS. The conductor layer 112 includes, for example, tungsten. The insulation layer 101 includes an insulator such as silicon oxide.

Below the conductor layer 112, insulation layers 102 and conductor layers 113 are alternately stacked in this order. Each of the conductor layers 113 is formed, for example, in a plate-like shape expanding along the XY plane. The plurality of conductor layers 113 are respectively used as the word lines WL0 to WL3 in order from the insulation layer 100 side. The conductor layers 113 include, for example, tungsten. The insulation layer 102 includes an insulator such as silicon oxide.

A conductor layer 114 is provided below the lowermost conductor layer 113 with an insulation layer 103 intervening therebetween. The conductor layer 114 is formed, for example, in a plate-like shape expanding along the XY plane. The conductor layer 114 serves as the select gate line SGD. The conductor layer 114 includes, for example, tungsten. The insulation layer 103 includes an insulator such as silicon oxide.

A conductor layer 115 is provided below the conductor layer 114 with an insulation layer 104 intervening therebetween. For example, the conductor layer 115 is formed in a line shape extending in the Y direction and serves as the in-plane interconnect HBLa. That is, in a region not shown, the plurality of conductor layers 115 are aligned in the X direction. The conductor layer 115 includes, for example, copper.

The insulation layer 104 covers the side portion and the lower portion of the plurality of conductor layers 115. An insulation layer 105 is provided on the lower surface of the insulation layer 104. The insulation layers 104 and 105 include, for example, an insulator such as silicon oxide.

The conductor layers 111 to 114 in the stack structure of the first memory chip MCa described above correspond to the stacked interconnect structure LSa. The member SLTa divides the conductor layers 112 to 114 of the stacked interconnect structure LSa. The member SHEa divides the conductor layer 114 of the stacked interconnect structure LSa.

The memory pillar MPa extends in the Z direction in such a manner as to penetrate the conductor layers 112 to 114. The upper end of the memory pillar MPa is in contact with the conductor layer 111. The lower end of the memory pillar MPa is positioned between the conductor layer 114 and the conductor layer 115.

Figure 8:
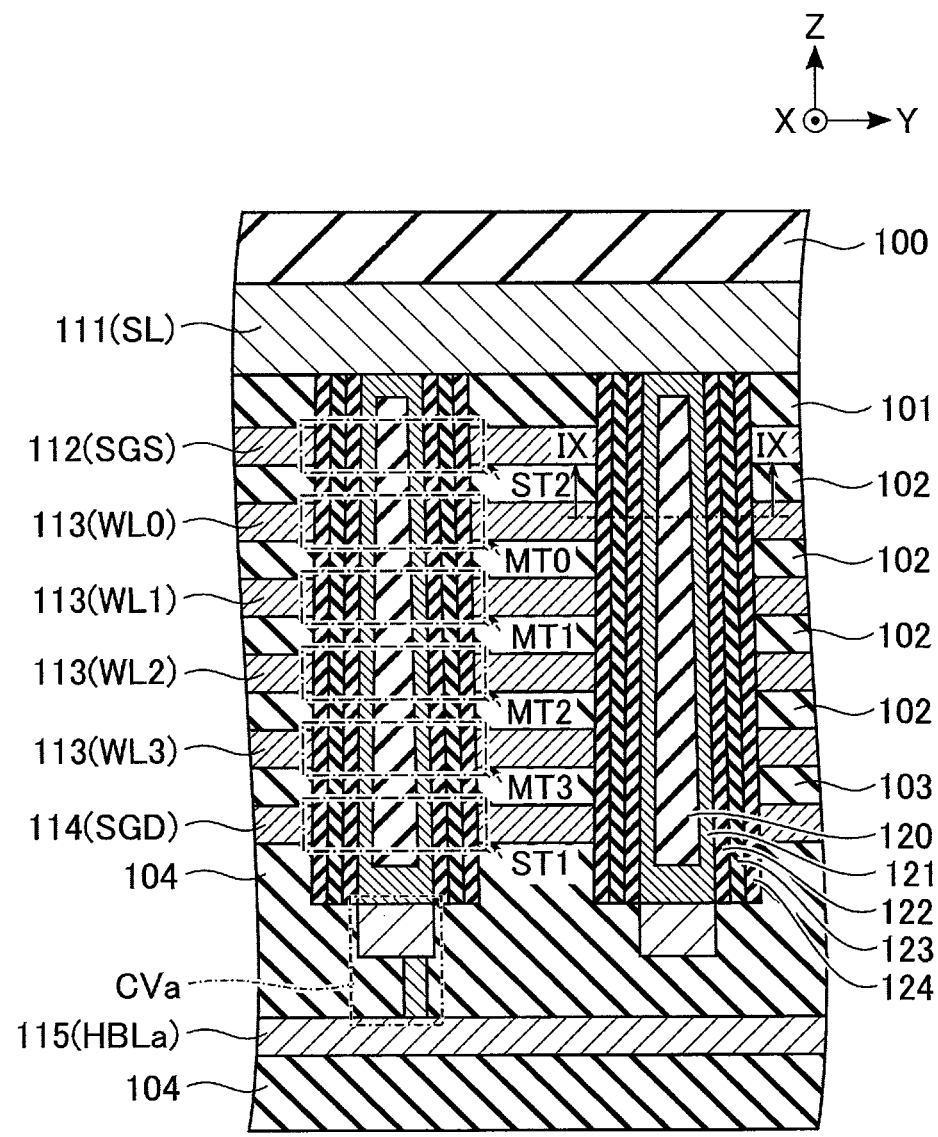
FIG. 8 is a sectional view corresponding to a region VIII of FIG. 7 and showing an exemplary sectional structure of a memory pillar of the memory device according to the first embodiment.

FIG. 8 is a sectional view corresponding to the region VIII of FIG. 7 and showing an exemplary sectional structure of a memory pillar of the memory device according to the first embodiment.

A portion at which the memory pillar MPa and the conductor layer 112 intersect each other functions as the select transistor ST2. A portion at which the memory pillar MPa and one conductor layer 113 intersect each other functions as one memory cell transistor MT. A portion at which the memory pillar MPa and the conductor layer 114 intersect each other functions as the select transistor ST1.

The memory pillar MPa includes a core film 120, a semiconductor film 121, a tunnel insulation film 122, a charge accumulation film 123, and a block insulation film 124. The core film 120 extends in the Z direction. For example, an upper end of the core film 120 is included in a layer above the conductor layer 112, and a bottom end of the core film 120 is positioned between the conductor layer 114 and the conductor layer 115. The semiconductor film 121 covers the core film 120. At the upper portion of the memory pillar MPa, a portion of the semiconductor film 121 is in contact with the conductor layer 111. The tunnel insulation film 122, the charge accumulation film 123, and the block insulation film 124 form a stacked film. The stacked film covers the side surface and the upper surface of the semiconductor film 121 except a portion at which the semiconductor film 121 and the conductor layer 111 are in contact with each other. The core film 120 includes, for example, an insulator made of silicon oxide, etc. The semiconductor film 121 includes, for example, silicon.

Figure 9:
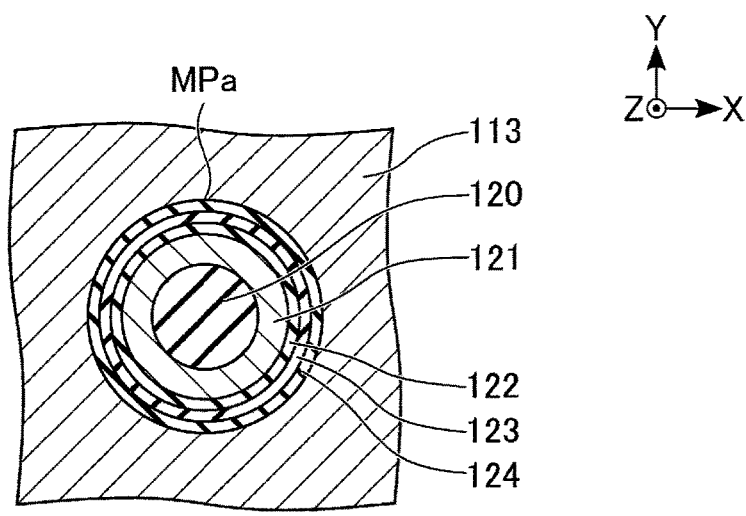
FIG. 9 is a sectional view taken along a line IX-IX of FIG. 8 and showing an exemplary sectional structure of a memory cell transistor of the memory device according to the first embodiment.

FIG. 9 is a sectional view taken along a line IX-IX of FIG. 8 and showing an exemplary sectional structure of a memory cell transistor of the memory device according to the first embodiment. More specifically, FIG. 9 shows a sectional structure of the memory pillar MPa in a layer including the conductor layer 113.

In the cross-section including the conductor layer 113, the core film 120 is provided in the center portion of the memory pillar MPa, for example. The semiconductor film 121 surrounds the side surface of the core film 120. The tunnel insulation film 122 surrounds the side surface of the semiconductor film 121. The charge accumulation film 123 surrounds the side surface of the tunnel insulation film 122. The block insulation film 124 surrounds the side surface of the charge accumulation film 123. The conductor layer 113 surrounds the side surface of the block insulation film 124.

Referring back to FIG. 7, a configuration of the first memory chip MCa will be described.

The lower surface of the semiconductor film 121 inside the memory pillar MPa is coupled to one conductor layer 115, that is, one in-plane interconnect HBLa, while the columnar contact Va extending in the Z direction intervenes between the aforementioned semiconductor 121 and the aforementioned in-plane interconnect HBLa. The example shown in FIG. 7 includes the memory pillar MPa coupled to the in-plane interconnect HBLa and the memory pillar MPa not coupled to the in-plane interconnect HBLa in the illustrated region. The memory pillar MPa not coupled to the in-plane interconnect HBLa via the contact Va in the illustrated region is coupled to another in-plane interconnect HBLa via the corresponding contact Va in a region not illustrated.

A columnar conductor 116 extending in the Z direction is provided on the lower surface of the conductor layer 115. The lower surface of the conductor 116 is flush with the lower surface of the insulation layer 104.

A conductor layer 117 is provided on the lower surface of the conductor 116. The conductor layer 117 is used as the bonding pad BP of the first memory chip MCa. The lower surface of the conductor layer 117 is flush with the lower surface of the insulation layer 105. The conductor layer 117 includes, for example, copper.

Next, a configuration of the second memory chip MCb will be described.

An insulation layer 200 is provided on the lower surface of the insulation layer 105, and a conductor layer 220 is provided on the lower surface of the conductor layer 117. The conductor layer 220 is used as the bonding pad BP at the first memory chip MCa side of the second memory chip MCb. The lower surface of the conductor layer 220 is flush with the lower surface of the insulation layer 200. The conductor layer 220 includes, for example, copper.

A conductor layer 211 is provided below the insulation layer 200 with an insulation layer 201 intervening therebetween. The conductor layer 211 is formed, for example, in a plate-like shape expanding along the XY plane and having an opening. The conductor layer 211 is used as the source line SL. An insulation layer 202 is provided in a region corresponding to the opening of the conductor layer 211 (the region not provided with the conductor layer 211) in the lower surface of the insulation layer 201. The lower surface of the conductor layer 211 is flush with the lower surface of the insulation layer 202. The conductor layer 211 includes, for example, polysilicon. The insulation layers 201 and 202 include, for example, an insulator such as silicon oxide.

A columnar conductor 221 extending in the Z direction is provided on the lower surface of the conductor layer 220. The conductor 221 passes through the insulation layer 202 without coming into contact with the conductor layer 211.

Figure 10:
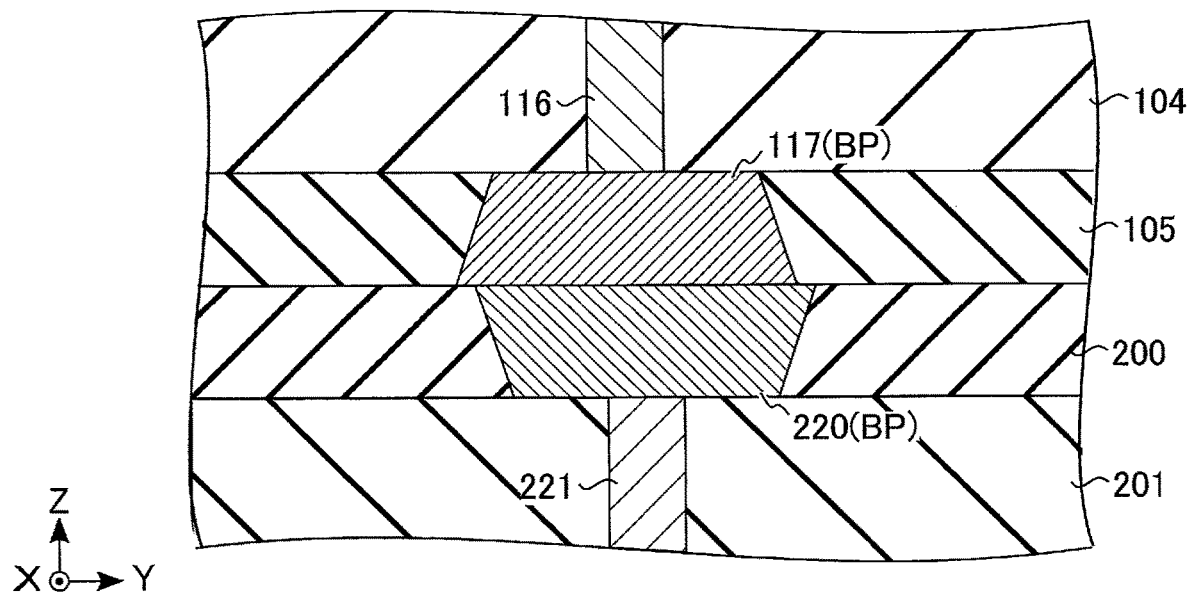
FIG. 10 is a sectional view corresponding to a region X of FIG. 7 and showing an exemplary sectional structure of a bonding pad of the memory device according to the first embodiment.

FIG. 10 is a sectional view corresponding to a region X of FIG. 7 and showing an exemplary sectional structure of a bonding pad of the memory device according to the first embodiment. FIG. 10 shows a detail of a sectional structure of the bonding pad BP configured to bond the first memory chip MCa and the second memory chip MCb together, and a vicinity of the bonding pad BP.

As shown in FIG. 10, in a step of bonding the first memory chip MCa to the second memory chip MCb, the conductor layer 117 is coupled to the conductor layer 220. In the example shown in FIG. 10, the conductor layers 117 and 220 in a bonding surface are substantially equal in area. In such a case, use of copper for the conductor layers 117 and 220 may cause integration of copper in the conductor layer 117 and copper in the conductor layer 220, thereby making it difficult to recognize a boundary in copper therebetween. However, bonding can be recognized according to distortion in the shape of the bonding layer 117 and the bonding layer 220 bonded together, which is caused by displacement in bonding, and according to displacement of barrier metals of copper (occurrence of discontiguous portions in the side surfaces).

Furthermore, in the case of forming the conductor layer 117 and the conductor layer 220 by a damascene method, the side surface of each of these layers has a tapered shape. For this reason, the sectional shape in the Z direction of a portion in which the conductor layer 117 is bonded to the conductor layer 220 shows that the side wall is shaped into a non-rectangular form, not a straight form.

Furthermore, in the case of bonding the conductor layer 117 to the conductor layer 220, the bottom surface, the side surface, and the upper surface of copper forming these layers are covered with a barrier metal. On the other hand, in a general interconnect layer using copper, an insulation layer (silicon nitride, silicon carbonitride, etc.) having a function of preventing oxidation of copper is formed on the upper surface of the copper, and no barrier metal is provided. In this manner, even if displacement in bonding has not occurred, the above configuration can be distinguished from a general interconnect layer.

Referring back to FIG. 7, a configuration of the second memory chip MCb will be described.

The conductor layer 212 is provided below the conductor layer 211 and the insulation layer 202 with an insulation layer 203 intervening therebetween. The conductor layer 212 is formed, for example, in a plate-like shape expanding along the XY plane. The conductor layer 212 serves as the select gate line SGS. The conductor layer 212 includes, for example, tungsten. The insulation layer 203 includes an insulator such as silicon oxide.

Below the conductor layer 212, insulation layers 204 and conductor layers 213 are alternately stacked in this order. The conductor layer 213 is formed, for example, in a plate-like shape expanding along the XY plane. The plurality of conductor layers 213 are respectively used as the word lines WL0 to WL3 in order from the insulation layer 200 side. The conductor layers 213 include, for example, tungsten. The insulation layer 204 includes an insulator such as silicon oxide.

A conductor layer 214 is provided below the lowermost conductor layer 213 with an insulation layer 205 intervening therebetween. The conductor layer 214 is formed, for example, in a plate-like shape expanding along the XY plane. The conductor layer 214 serves as the select gate line SGD. The conductor layer 214 includes, for example, tungsten. The insulation layer 205 includes an insulator such as silicon oxide.

Three conductor layers 215 aligned in the Y direction are provided below the conductor layer 214 with an insulation layer 206 intervening therebetween. For example, three conductor layers 215 aligned in the Y direction are formed in, for example, a line shape extending in the Y direction, and serve as the in-plane interconnects HBLb1, HBLb2, and HBLb3. That is, in a region not shown, a plurality of sets of three conductor layers 215 aligned in the Y direction are aligned in the X direction. Each conductor layer 215 includes, for example, copper.

The insulation layer 206 covers the side portion and the lower portion of the plurality of conductor layers 215. An insulation layer 207 is provided on the upper surface of the insulation layer 206. The insulation layers 206 and 207 include, for example, an insulator such as silicon oxide.

The conductor layers 211 to 214 in the stack structure of the second memory chip MCb described above correspond to the stacked interconnect structure LSb. The member SLTb divides the conductor layers 212 to 214 of the stacked interconnect structure LSb. The member SHEb (not shown) divides the conductor layer 214 of the stacked interconnect structure LSb.

The memory pillar MPb extends in the Z direction in such a manner as to penetrate the conductor layers 212 to 214. The upper end of the memory pillar MPb is in contact with the conductor layer 211. The lower end of the memory pillar MPb is positioned between the conductor layer 214 and the conductor layer 215. A description of the configuration of the memory pillar MPb is omitted because it is equivalent to that of the memory pillar MPa.

The lower surface of the semiconductor film inside the memory pillar MPb is coupled to one conductor layer 215 corresponding to the in-plane interconnect HBLb1 or one conductor layer 215 corresponding to the in-plane interconnect HBLb2 with the columnar contact Vb intervening therebetween. The example shown in FIG. 7 includes the memory pillar MPb coupled to the in-plane interconnect HBLb1, the memory pillar MPb coupled to the in-plane interconnect HBLb2, and the memory pillars MPb coupled to neither the in-plane interconnect HBLb1 nor the in-plane interconnect HBLb2 in the illustrated region. Of the memory pillars MPb coupled to neither the in-plane interconnect HBLb1 nor the in-plane interconnect HBLb2 in the illustrated region, the memory pillar MPb arranged at a position at which it overlaps with the in-plane interconnect HBLb1 when viewed in the Z direction is coupled to the aforementioned in-plane interconnect HBLb1 with the corresponding contact Vb intervening therebetween in an unillustrated region. Of the memory pillars MPb coupled to neither the in-plane interconnect HBLb1 nor the in-plane interconnect HBLb2, the memory pillar MPb arranged at a position at which it overlaps with the in-plane interconnect HBLb2 when viewed in the Z direction is coupled to the aforementioned in-plane interconnect HBLb2 with the corresponding contact Vb intervening therebetween in an unillustrated region.

The contacts CV extend in the Z direction in such a manner as to penetrate the conductor layers 212 to 214. The upper end of each of the contacts CV is in contact with the conductor 221. The lower end of the contact CV is positioned between the conductor layer 214 and the conductor layer 215. The contacts CV are electrically insulated from the conductor layers 212 to 214 by means of insulating spacers SP that cover the side portions of the contacts CV, respectively.

The lower surface of the contact CV is coupled to one conductor layer 215 corresponding to the in-plane interconnect HBLb3 with the columnar contact Vab intervening therebetween. The example shown in FIG. 7 includes one contact CV coupled to the in-plane interconnect HBLb3, and three contacts CV not coupled thereto. The contacts CV not coupled to the in-plane interconnect HBLb3 via the contact Vab are coupled to another in-plane interconnect HBLb3 via the corresponding contact Vab in a region not illustrated.

Columnar conductors 216 extending in the Z direction are respectively provided on the lower surfaces of the three conductor layers 215 aligned in the Y direction. Conductor layers 217 are respectively provided on the lower surfaces of the conductors 216. Columnar conductors 218 extending in the Z direction are respectively provided on the lower surfaces of the conductor layers 217. The lower surfaces of the conductors 218 are flush with the lower surface of the insulation layer 206, for example.

Conductor layers 219 are respectively provided on the lower surfaces of the conductors 218. Each of the conductor layers 219 is used as the bonding pad BP at the CMOS chip CC side of the second memory chip MCb. The lower surfaces of the conductor layers 219 are flush with the lower surface of the insulation layer 207, for example.

Next, a configuration at the CMOS chip CC side will be described.

An insulation layer 300 is provided on the lower surface of the insulation layer 207, and a conductor layer 311 is provided on the lower surface of the conductor layer 219. The conductor layer 311 is used as the bonding pad BP of the CMOS chip CC. The lower surface of the conductor layer 311 is flush with the lower surface of the insulation layer 300. The conductor layer 311 contains, for example, copper.

A description of the configuration of a bonding pad BP configured to bond the second memory chip MCb and the CMOS chip CC together, and the configuration of the vicinity of the bonding pad BP, is omitted because these configurations are equivalent to those of the bonding pad BP configured to bond the first memory chip MCa and the second memory chip MCb together, and the vicinity of the bonding pad BP.

A semiconductor substrate 302 is provided on the lower surface of the insulation layer 300 with an insulation layer 301 intervening therebetween. The insulation layers 300 and 301 include, for example, an insulator such as silicon oxide. The semiconductor substrate 302 is, for example, polysilicon including p-type impurities. The semiconductor substrate 302 includes a plurality of well regions (not shown). In the well regions, for example, various types of elements in the selection circuit 16 including the transistors Ta and Tb are formed. The well regions are separated by, for example, an STI (Shallow Trench Isolation).

A columnar conductor 312 extending in the Z direction is provided on the lower surface of the conductor layer 311. A conductor layer 313 is provided on the lower surface of the conductor 312. The conductor layer 313 coupled to the in-plane interconnect HBLb2 is coupled to the conductor layer 313 coupled to the in-plane interconnect HBLb1 while an interconnect (not shown) intervenes between these layers. By this, the in-plane interconnects HBLb1 an HBLb2 are electrically coupled together.

A columnar conductor 314 extending in the Z direction is provided on the lower surface of the conductor layer 313. A conductor layer 315 is provided on the lower surface of the conductor 314. A columnar conductor 316 extending in the Z direction is provided on the lower surface of the conductor layer 315. The lower surface of the conductor 316 coupled to the in-plane interconnects HBLb1 and HBLb2 is coupled to the first end of the transistor Tb formed on the semiconductor substrate 302. The lower surface of the conductor 316 coupled to the in-plane interconnect HBLb3 is coupled to the first end of the transistor Ta formed on the semiconductor substrate 302. The second ends of the transistors Ta and Tb are electrically coupled by means of the conductor layer 317.

In the configuration described above, the out-plane interconnect VBLa is constituted by the conductor 116, the conductor layer 117, the conductor layer 220, the conductor 221, the contact CV, the contact Vab, the conductor 216 coupled to the conductor layer 215 corresponding to the in-plane interconnect HBLb3 and to the conductor layer 215 corresponding to the in-plane interconnect HBLb3, the conductor layer 217, the conductor 218, the conductor layer 219, the conductor layer 311, the conductor 312, the conductor layer 313, the conductor 314, the conductor layer 315, and the conductor 316. The out-plane interconnect VBLb1 is constituted by the conductor 216 coupled to the conductor layer 215 corresponding to the in-plane interconnect HBLb1, the conductor layer 217, the conductor 218, the conductor layer 219, the conductor layer 311, the conductor 312, the conductor layer 313, the conductor 314, the conductor layer 315, and the conductor 316. The out-plane interconnect VBLb2 is constituted by the conductor 216 coupled to the conductor layer 215 corresponding to the in-plane interconnect HBLb2, the conductor layer 217, the conductor 218, the conductor layer 219, the conductor layer 311, the conductor 312, and the conductor layer 313.

With the configuration described above, each of the in-plane interconnects HBLa in the first memory chip MCa is electrically coupled to the transistor Ta of the corresponding selection circuit 16 in the CMOS chip CC while the contact CV extending in the Z direction in the block BLKb x of the second memory chip MCb intervenes between the in-plane interconnect HBLa and the transistor Ta. After the in-plane interconnects HBLb1 and HBLb2 in the second memory chip MCb are electrically coupled together in the CMOS chip CC, they are electrically coupled to the transistor Tb of the corresponding selection circuit 16 in the CMOS chip CC.

Figure 11:
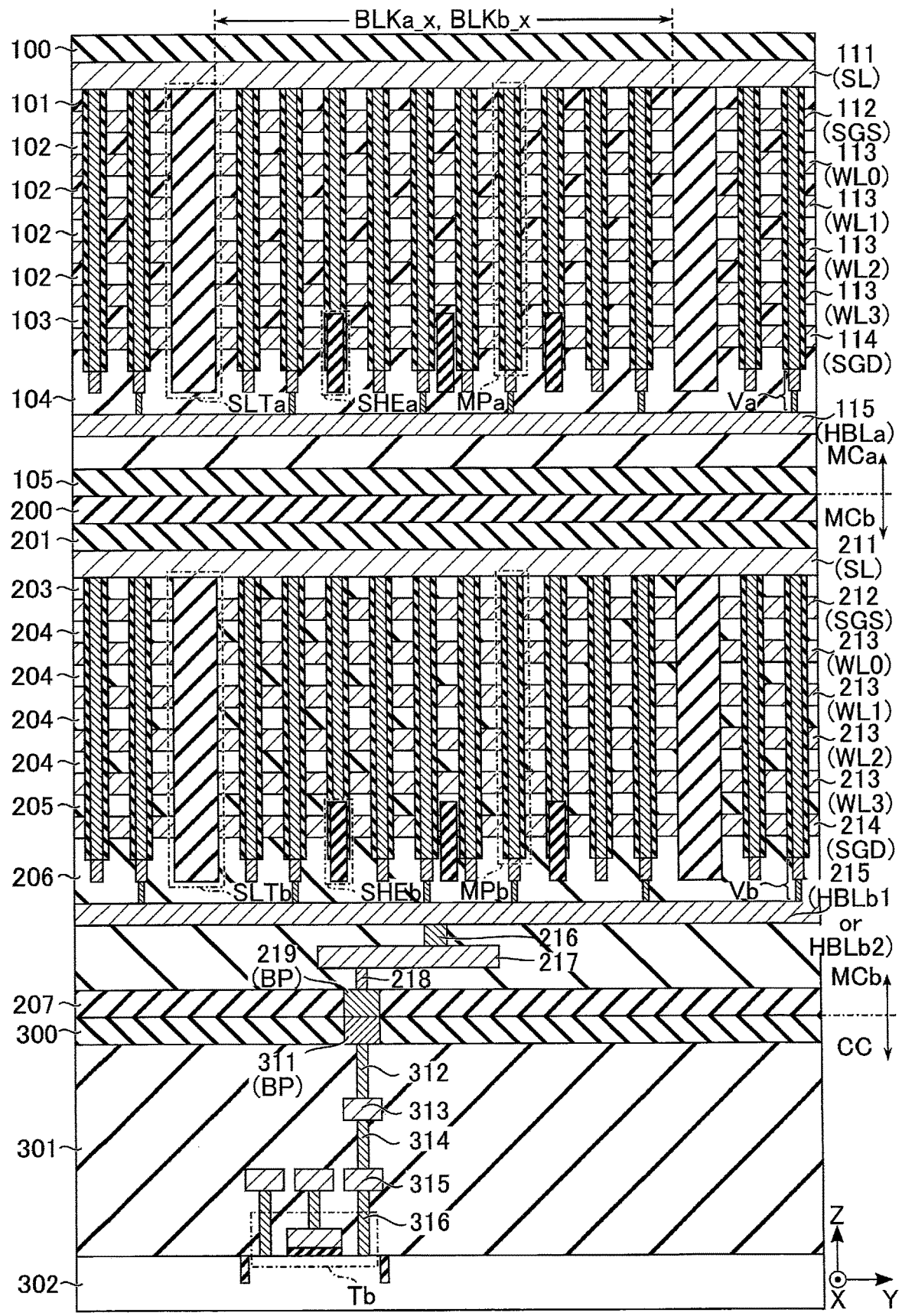
FIG. 11 is a sectional view taken along a line XI-XI of FIG. 5 and FIG. 6 and showing an exemplary sectional structure of the memory device according to the first embodiment.

1.1.8 Sectional Structure of Memory Device in Cross Section Excluding Out-plane Interconnect VBLa FIG. 11 is a sectional view taken along a line XI-XI of FIGS. 5 and 6 and showing an exemplary sectional structure of the memory device according to the first embodiment.

In the block BLKb x, the cross section excluding the out-plane interconnect VBLa is provided with the memory pillars MPb. The upper ends of the memory pillars MPb in the block BLKb x are in contact with the conductor layer 211. The lower end of each of the memory pillars MPb in the block BLKb x is coupled to one conductor layer 215 corresponding to the in-plane interconnect HBLb1 or one conductor layer 215 corresponding to the in-plane interconnect HBLb2 with the contact Vb intervening therebetween.

As described above, formation of the memory pillars MPb in a region not provided with the out-plane interconnect VBLa in the block BLKb x enables this region to be used as a data storage region.

1.2 Advantageous Effects of First Embodiment

According to the first embodiment, the in-plane interconnects HBLb1 and HBLb2 of the bit line BLb are aligned in the Y direction inside the second memory chip MCb. The out-plane interconnect VBLa of the bit line BLa includes the contact CV that passes through the stacked interconnect structure LSb between the in-plane interconnects HBLb1 and HBLb2. This enables the contacts CV to be dispersed and arranged inside the second memory chip MCb. Thus, the bit line BLa can be coupled to the CMOS chip CC without being routed through the outer periphery of the memory region MRb. This can suppress the increase in parasitic capacitance of the bit line BLa.

Furthermore, the in-plane interconnects HBLb1 and HBLb2 are electrically coupled together at the CMOS chip CC side, thereby being commonly coupled to the first end of the transistor Tb. This enables the in-plane interconnects HBLb1 and HBLb2 aligned alongside the contact CV in the Y direction to be utilized as one bit line BLb. Therefore, the same number of bit lines BLb as the number of bit lines BLa can be formed without imposing the restriction on the arrangement of the bit lines BLb in the second memory chip MCb. This can suppress the increase in chip size of the second memory chip MCb while increasing a memory capacity.

Along with the contacts CV being dispersed and arranged in the second memory chip MCb, the selection circuit 16 and the sense amplifier module 17 are dispersed and arranged on the semiconductor substrate 302. This can facilitate routing of the bit line BLa to the selection circuit 16 and the sense amplifier module 17.

Furthermore, the out-plane interconnect VBLa is provided between the in-plane interconnects HBLb1 and HBLb2, and includes the in-plane interconnect HBLb3 aligned alongside the in-plane interconnects HBLb1 and HBLb2 in the Y direction. The contact CV is arranged at a position at which it overlaps with the in-plane interconnect HBLb3 when viewed in the Z direction. This enables the contact CV to be drawn to the CMOS chip CC side without interfering with the in-plane interconnects HBLb1 and HBLb2. The in-plane interconnect HBLb3 is formed concurrently with forming the in-plane interconnects HBLb1 and HBLb2 by dividing one interconnect extending in the Y direction. Thus, by utilizing the in-plane interconnect HBLb3 for coupling between the contacts CV and the selection circuit 16, the load of forming a new configuration for drawing the contacts CV to the CMOS chip CC side can be suppressed.

Furthermore, the selection circuit 16 is configured to select one from a pair of the bit lines BLa and BLb. Specifically, the selection circuit 16 includes the transistors Ta and Tb. The transistor Ta has a first end coupled to the bit line BLa and a control end to which a signal CPsel is supplied. The transistor Tb has a first end coupled to the bit line BLb, a second end coupled to a second end of the transistor Ta, and a control end to which a signal /CPsel is supplied. This enables the selection circuit 16 to control the block group 10a in the first memory chip MCa and the block group 10b in the second memory chip MCb separately from each other via the bit lines BLa and BLb. Thus, the word lines WL and the select gate lines SGS and SGD in the first memory chip MCa can be commonly coupled to the word lines WL and the select gate lines SGS and SGD in the second memory chip MCb, respectively. This can facilitate coupling of the word lines WL and the select gate lines SGS and SGD to the CMOS chip CC as compared to the case in which the word lines WL and the select gate lines SGS and SGD are controlled independently between the chips.

2. Second Embodiment

Next, a second embodiment will be described.

The second embodiment differs from the first embodiment in that the contacts CV are formed inside the member SLTb, not inside the block BLKb. The description provided below will concentrate on mainly the aspects of the configuration different from those of the first embodiment. A description of the aspects of the configuration equivalent to those of the first embodiment will be omitted as appropriate.

2.1 Layout of Bit Line

Figure 12:
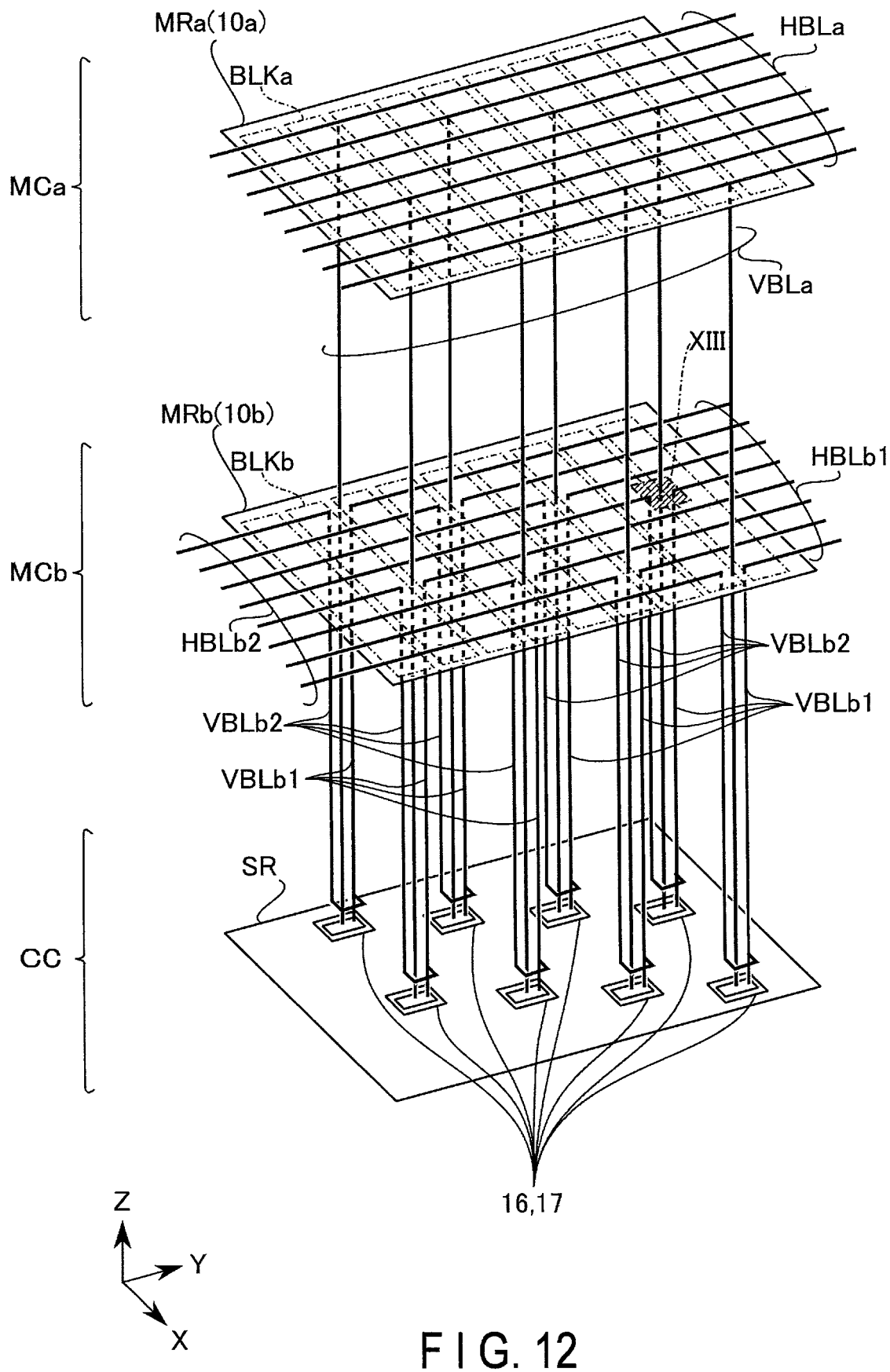
FIG. 12 is a view showing an exemplary three-dimensional layout of bit lines of a memory device according to a second embodiment.

FIG. 12 is a view showing an exemplary three-dimensional layout of bit lines of a memory device according to the second embodiment. FIG. 12 corresponds to FIG. 4 to which reference was made in the first embodiment.

The plurality of in-plane interconnects HBLa are aligned in the X direction within the memory region MRa of the first memory chip MCa. Each of the in-plane interconnects HBLa has a portion that extends in the Y direction in such a manner as to cross all of the blocks BLKa of the block group 10a. Each of the in-plane interconnects HBLa is coupled to the corresponding out-plane interconnect VBLa at a position that overlaps with a region between the corresponding two blocks BLKa when viewed in the Z direction (that is, a region provided with the member SLTa). Positions at which the out-plane interconnects VBLa and the in-plane interconnects HBLa are coupled together are dispersed and arranged in a plurality of regions of the memory region MRa. FIG. 12 shows an exemplary case in which the positions at which the out-plane interconnects VBLa and the in-plane interconnects HBLa are coupled together are dispersed and arranged in eight regions of the memory region MRa.

Each of the out-plane interconnects VBLa has a first end coupled to the corresponding in-plane interconnect HBLa, a second end coupled to the selection circuit 16, and a middle portion that extends through the memory region MRb of the second memory chip MCb. A middle portion of the out-plane interconnect VBLa passes through a gap between the corresponding two blocks BLKb when viewed in the Z direction (that is, a region provided with the member SLTb).

The plurality of in-plane interconnects HBLb1 are aligned in the X direction within the memory region MRb of the second memory chip MCb. Each of the in-plane interconnects HBLb1 has a portion that extends in the Y direction in such a manner as to cross at least one of the blocks BLKb within the block group 10b.

The plurality of in-plane interconnects HBLb2 are aligned in the X direction within the memory region MRb of the second memory chip MCb. Each of the in-plane interconnects HBLb2 has a portion that extends in the Y direction in such a manner as to cross at least one of the blocks BLKb within the block group 10b. Each of the in-plane interconnects HBLb2 is aligned in the Y direction with the corresponding in-plane interconnect HBLb1. A middle portion of the out-plane interconnect VBLa passes through a gap between the corresponding in-plane interconnects HBLb1 and HBLb2 aligned in the Y direction.

Each of the out-plane interconnects VBLb1 has a first end coupled to the corresponding in-plane interconnect HBLb1, a second end coupled to the selection circuit 16, and a middle portion passing through the inside of the CMOS chip CC. The transistor Tb to which the second end of the out-plane interconnect VBLb1 is coupled is arranged in a vicinity of the transistor Ta to which the second end of the corresponding out-plane interconnect VBLa is coupled.

Each of the out-plane interconnects VBLb2 has a first end coupled to the corresponding in-plane interconnect HBLb2, a second end coupled to a middle portion of the corresponding out-plane interconnect VBLb1, and a middle portion passing through the inside of the CMOS chip CC. The second end of the out-plane interconnect VBLb2 is arranged inside the CMOS chip CC.

2.2 Planar Layout of Memory Cell Array

FIG. 13 is a plan view corresponding to a region XIII of FIG. 12 and showing an exemplary planar layout in the second memory chip of the memory cell array of the memory device according to the second embodiment. FIG. 13 corresponds to FIG. 6 showing the first embodiment. FIG. 13 shows a region including a portion corresponding to the block BLKb x in the memory region MRb and a vicinity of the aforementioned portion ($1 \leq x \leq n-1$). The block BLKb x corresponds to the block BLKb sandwiched between the two members SLTb each of which allows the middle portion of the out-plane interconnect VBLa to pass therethrough in the Z direction. In the memory region MRb, the memory cell array includes the stacked interconnect structure LSb, the plurality of members SLTb and SHEb, the plurality of memory pillars MPb, the plurality of contacts Vb, Vab, and CV, and the plurality of in-plane interconnects HBLb1, HBLb2, and HBLb3.

The configurations of the stacked interconnect structure LSb, the plurality of members SHEb, the plurality of memory pillars MPb, the plurality of contacts Vb, and the plurality of in-plane interconnects HBLb1 and HBLb2 according to the second embodiment are equivalent to those of the first embodiment, so that a description of these configurations will be omitted.

The plurality of members SLTb are, for example, plate shaped insulators extending along the XZ plane. The plurality of members SLTb are aligned in the Y direction. Each of the members SLTb extends in the X direction in such a manner as to traverse the memory region MRb and the hookup regions HR1b and HR2b in a boundary region between the adjacent blocks BLKb. Each of the members SLTb divides into two portions aligned in the Y direction the conductors layer that are included in the stacked interconnect structure LSb and correspond to the word lines WL and the select gate lines SGD and SGS The plurality of contacts CV are provided in each of the members SLTb. FIG. 13 shows an exemplary case in which the plurality of contacts CV are provided in each of the two members SLTb that sandwich the block BLKb x. The plurality of contacts CV in one member SLTb are arranged in such a manner as to be aligned apart from each other in the X direction, for example. Each of the contacts CV corresponds to the middle portion of the out-plane interconnect VBLa.

Each of the in-plane interconnects HBLb3 is arranged in such a manner as to overlap with at least one contact CV arranged in the two members SLTb that sandwich the block BLKb x. FIG. 13 shows an exemplary case in which three in-plane interconnects HBLb3 are arranged in such a manner as to overlap with one contact CV. One of the plurality of in-plane interconnects HBLb3 that overlap with the contact CV and one contact CV are electrically coupled together via a contact Vab.

2.3 Sectional Structure of Memory Device

FIG. 14 is a sectional view taken along a line XIV-XIV of FIG. 13 and showing an exemplary sectional structure of the memory device according to the second embodiment. FIG. 14 corresponds to FIG. 7 showing the first embodiment. Hereinafter, a portion relating to the out-plane interconnects VBLa in the second memory chip MCb will be mainly described.

An insulation layer 200 is provided on the lower surface of the insulation layer 105, and a conductor layer 220 is provided on the lower surface of the conductor layer 117. The conductor layer 220 is used as the bonding pad BP at the first memory chip MCa side of the second memory chip MCb. The lower surface of the conductor layer 220 is flush with the lower surface of the insulation layer 200. The conductor layer 220 includes, for example, copper.

A conductor layer 211 is provided below the insulation layer 200 with an insulation layer 201 intervening therebetween. The conductor layer 211 is formed, for example, in a plate-like shape expanding along the XY plane and having an opening. The conductor layer 211 is used as the source line SL. An insulation layer 202 is provided in a region corresponding to the opening of the conductor layer 211 (the region not provided with the conductor layer 211) in the lower surface of the insulation layer 201. The lower surface of the conductor layer 211 is flush with the lower surface of the insulation layer 202. The conductor layer 211 includes, for example, polysilicon. The insulation layers 201 and 202 include, for example, an insulator such as silicon oxide. A columnar conductor 221 extending in the Z direction is provided on the lower surface of the conductor layer 220. The conductor 221 passes through the insulation layer 202 without coming into contact with the conductor layer 211.

Below the conductor layer 211 and the insulation layer 202, the stacked interconnect structure LSb including the conductor layers 212 to 214 is provided. Three conductor layers 215 aligned in the Y direction are provided below the stacked interconnect structure LSb with the insulation layer 206 intervening therebetween. For example, three conductor layers 215 aligned in the Y direction are formed in, for example, a line shape extending in the Y direction, and serve as the in-plane interconnects HBLb1, HBLb2, and HBLb3. The member SLTb divides the conductor layers 212 to 214 of the stacked interconnect structure LSb. The member SHEb (not shown) divides the conductor layer 214 of the stacked interconnect structure LSb.

The lower surface of the semiconductor film inside the memory pillar MPb is coupled to one conductor layer 215 corresponding to the in-plane interconnect HBLb1 or one conductor layer 215 corresponding to the in-plane interconnect HBLb2 with the columnar contact Vb intervening therebetween. The example shown in FIG. 14 includes the memory pillar MPb coupled to the in-plane interconnect HBLb1, the memory pillar MPb coupled to the in-plane interconnect HBLb2, and the memory pillars MPb coupled to neither the in-plane interconnect HBLb1 nor the in-plane interconnect HBLb2 in the illustrated region. Of the memory pillars MPb coupled to neither the in-plane interconnect HBLb1 nor the in-plane interconnect HBLb2 in the illustrated region, the memory pillar MPb arranged at a position at which it overlaps with the in-plane interconnect HBLb1 when viewed in the Z direction is coupled to the aforementioned in-plane interconnect HBLb1 with the corresponding contact Vb intervening therebetween in an unillustrated region. Of the memory pillars MPb coupled to neither the in-plane interconnect HBLb1 nor the in-plane interconnect HBLb2, the memory pillar MPb arranged at a position at which it overlaps with the in-plane interconnect HBLb2 when viewed in the Z direction is coupled to the aforementioned in-plane interconnect HBLb2 with the corresponding contact Vb intervening therebetween in an unillustrated region. Of the memory pillars MPb coupled to neither the in-plane interconnect HBLb1 nor the in-plane interconnect HBLb2 in the illustrated region, the memory pillar MPb arranged at a position at which it overlaps with neither the in-plane interconnect HBLb1 nor the in-plane interconnect HBLb2 when viewed in the Z direction is coupled to neither the in-plane interconnect HBLb1 nor the in-plane interconnect HBLb2 in an unillustrated region, too.

The contacts CV extend in the Z direction in such a manner as to penetrate the member SLTb. The upper end of each of the contacts CV is in contact with the conductor 221. The lower end of the contact CV is positioned between the conductor layer 214 and the conductor layer 215. The contacts CV are electrically insulated from the conductor layers 212 to 214 by means of insulating spacers SP that cover the side portions of the contacts CV, respectively. The lower surface of the contact CV is coupled to one conductor layer 215 corresponding to the in-plane interconnect HBLb3 with the columnar contact Vab intervening therebetween.

Columnar conductors 216 extending in the Z direction are respectively provided on the lower surfaces of the three conductor layers 215 aligned in the Y direction. Conductor layers 217 are respectively provided on the lower surfaces of the conductors 216. Columnar conductors 218 extending in the Z direction are respectively provided on the lower surfaces of the conductor layers 217. The lower surfaces of the conductors 218 are flush with the lower surface of the insulation layer 206, for example.

Conductor layers 219 are respectively provided on the lower surfaces of the conductors 218. Each of the conductor layers 219 is used as the bonding pad BP at the CMOS chip CC side of the second memory chip MCb. The lower surfaces of the conductor layers 219 are flush with the lower surface of the insulation layer 207, for example.

In the configuration described above, the out-plane interconnect VBLa is constituted by the conductor layer 220, the conductor 221, the contact CV, the contact Vab, the conductor 216 coupled to the conductor layer 215 corresponding to the in-plane interconnect HBLb3 and coupled to the conductor layer 215 corresponding to the in-plane interconnect HBLb3, the conductor layer 217, the conductor 218, and the conductor layer 219.

With the configuration described above, each of the in-plane interconnects HBLa in the first memory chip MCa is electrically coupled to the transistor Ta of the corresponding selection circuit 16 in the CMOS chip CC while the contact CV extending in the Z direction in the member SLTb of the second memory chip MCb intervenes between the in-plane interconnect HBLa and the transistor Ta.

2.4 Advantageous Effects of Second Embodiment

According to the second embodiment, the contacts CV are formed inside the member SLTb. This can produce advantageous effects equivalent to those of the first embodiment while suppressing separate formation of the memory pillars MPb and the contacts CV in the stacked interconnect structure LSb.

3. Modification, Etc.

The first and second embodiments described above may adopt various modifications.

For example, the first embodiment described the case in which each of the members SLTa and SLTb is filled with the insulator; however, this case is not a limitation. For example, each of the members SLTa and SLTb may have a configuration in which the side surface of the conductor in contact with the source line SL is covered with the insulator. By this, voltage can be supplied to the source line SL via the conductors in the members SLTa and SLTb.

The above modification to the first embodiment is applicable to the second embodiment in a similar manner. In the case of applying the above modification to the second embodiment, the conductor in contact with the source line SL inside each of the members SLTa and SLTb is required to be electrically insulated from the contact CV.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising:
   a substrate;
   a plurality of first conductor layers aligned apart from each other in a first direction;
   a second conductor layer and a third conductor layer each extending in a second direction intersecting the first direction between the substrate and the plurality of first conductor layers, the second conductor layer and the third conductor layer being aligned apart from each other in the second direction;
   a plurality of fourth conductor layers aligned apart from each other in the first direction on an opposite side of the substrate with respect to the plurality of first conductor layers;
   a fifth conductor layer extending in the second direction between the plurality of first conductor layers and the plurality of fourth conductor layers;
   a first memory pillar extending in the first direction, intersecting the plurality of first conductor layers, and coupled to the second conductor layer or the third conductor layer;
   a second memory pillar extending in the first direction, intersecting the plurality of fourth conductor layers, and coupled to the fifth conductor layer; and
   a first interconnect coupling between the fifth conductor layer and the substrate,
   wherein the first interconnect includes a contact extending in the first direction and passing through the plurality of first conductor layers between the second conductor layer and the third conductor layer.

2. The memory device according to claim 1, further comprising a first member and a second member each dividing the plurality of first conductor layers,
   wherein the contact is provided between the first member and the second member.

3. The memory device according to claim 1, wherein the contact overlaps with the second memory pillar when viewed in the first direction.

4. The memory device according to claim 1, further comprising a first member dividing the plurality of first conductor layers,
   wherein the contact overlaps with the first member.

5. The memory device according to claim 4, wherein the contact is displaced from the second memory pillar when viewed in the first direction.

6. The memory device according to claim 1, further comprising:
   a first chip including the substrate;
   a second chip including the plurality of first conductor layers, the second conductor layer, the third conductor layer, and the contact; and
   a third chip including a plurality of fourth conductor layers and a fifth conductor layer.

7. The memory device according to claim 1, further comprising a sixth conductor layer extending in the second direction, aligned alongside the second conductor layer and the third conductor layer in the second direction, and positioned between the second conductor layer and the third conductor layer.

8. The memory device according to claim 7, wherein the sixth conductor layer couples between the contact and the substrate.

9. The memory device according to claim 7, wherein the contact overlaps with the sixth conductor layer when viewed in the first direction.

10. The memory device according to claim 7, wherein the contact overlaps with the fifth conductor layer when viewed in the first direction.

11. The memory device according to claim 7, wherein the fifth conductor layer overlaps with the second conductor layer, the third conductor layer, and the sixth conductor layer when viewed in the first direction.

12. The memory device according to claim 1, further comprising a second interconnect configured to couple the second conductor layer and the third conductor layer in parallel to the substrate.

13. The memory device according to claim 12, further comprising:
a first transistor provided on the substrate and including a first end coupled to the first interconnect; and
a second transistor provided on the substrate and including a first end coupled to the second interconnect and a second end coupled to a second end of the first transistor.

14. The memory device according to claim 13, further comprising:
a seventh conductor layer aligned alongside the second conductor layer in a third direction intersecting the first direction and the second direction, the seventh conductor layer extending in the second direction;
an eighth conductor layer aligned alongside the third conductor layer in the third direction, extending in the second direction, and aligned alongside the seventh conductor layer in the second direction;
a ninth conductor layer aligned alongside the fifth conductor layer in the third direction and extending in the second direction;
a third interconnect coupling between the ninth conductor layer and the substrate;
a fourth interconnect coupling the seventh conductor layer and the eighth conductor layer in parallel to the substrate;
a third transistor provided on the substrate and including a first end coupled to the third interconnect; and
a fourth transistor provided on the substrate and including a first end coupled to the fourth interconnect and a second end coupled to a second end of the third transistor,
wherein a pair of the first transistor and the second transistor and a pair of the third transistor and the fourth transistor are provided in regions separated from each other on the substrate.

15. The memory device according to claim 1, wherein the plurality of first conductor layers are respectively coupled to the plurality of fourth conductor layers.

16. A memory device comprising:
a first chip, a second chip, and a third chip stacked in a first direction in this order;
a first memory cell provided on the first chip;
a second memory cell provided on the second chip;
a first bit line coupled to the first memory cell;
a second bit line coupled to the second memory cell; and
a selection circuit provided on the third chip and configured to select one of the first bit line and the second bit line,
wherein
the first bit line includes:
a first interconnect provided on the first chip and coupled to the first memory cell;
a second interconnect coupling between the first interconnect and the selection circuit,
the second bit line includes:
a third interconnect provided on the second chip and coupled to the second memory cell in the second chip;
a fourth interconnect provided on the second chip and not coupled to the second memory cell in the second chip; and
a fifth interconnect coupling among the third interconnect, the fourth interconnect, and the selection circuit, and
the second interconnect passes through the second memory cell in the first direction between the third interconnect and the fourth interconnect.

17. The memory device according to claim 16, wherein the selection circuit includes:
a first transistor including a first end coupled to the second interconnect; and
a second transistor including a first end coupled to the fifth interconnect and a second end coupled to a second end of the first transistor.

18. The memory device according to claim 16, further comprising a third memory cell provided on the second chip and coupled to the fourth interconnect in the second chip,
wherein the second memory cell and the third memory cell are respectively correlated with identical column addresses.

19. The memory device according to claim 16, wherein the second bit line further includes a sixth interconnect provided on the second chip and aligned alongside the second interconnect and the third interconnect in a second direction intersecting the first direction.

20. The memory device according to claim 19, wherein each of the second interconnect, the third interconnect, and the sixth interconnect extends in the second direction.

* * * * *